(12) United States Patent
Ukita et al.

(10) Patent No.: US 6,218,724 B1
(45) Date of Patent: *Apr. 17, 2001

(54) THIN FILM TRANSISTOR USED IN SEMICONDUCTOR MEMORY FOR ACHIEVING REDUCTION IN POWER CONSUMPTION

(75) Inventors: Motomu Ukita; Toshihiko Hirose; Shigeto Maegawa, all of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/879,449
(22) Filed: Jun. 20, 1997

Related U.S. Application Data

(62) Division of application No. 08/676,596, filed on Jul. 3, 1996, now Pat. No. 5,726,945.

(30) Foreign Application Priority Data

Oct. 24, 1995 (JP) .................................................. 7-275918

(51) Int. Cl.⁷ ..................................................... H01L 27/11
(52) U.S. Cl. .......................... 257/538; 257/380; 257/393; 257/904
(58) Field of Search ................................... 257/359, 904, 257/903, 347, 379, 380, 350, 536, 537, 538, 393

(56) References Cited

U.S. PATENT DOCUMENTS

| | | | |
|---|---|---|---|
| 4,504,743 | * | 3/1985 | Aoyama et al. ...................... 307/310 |
| 5,162,889 | * | 11/1992 | Itomi ....................................... 257/69 |
| 5,258,947 | | 11/1993 | Sourgen . |
| 5,293,334 | | 3/1994 | Shimizu . |
| 5,296,726 | * | 3/1994 | MacElwee ............................ 257/213 |
| 5,297,099 | | 3/1994 | Bolan et al. . |
| 5,500,553 | * | 3/1996 | Ikegami ................................ 257/538 |
| 5,521,401 | * | 5/1996 | Zamanian et al. ...................... 257/67 |
| 5,572,046 | * | 11/1996 | Takemura ................................ 257/66 |
| 5,583,369 | * | 12/1996 | Yamazaki et al. .................... 257/635 |
| 5,596,212 | * | 1/1997 | Kuriyama ............................. 257/298 |
| 5,619,056 | * | 4/1997 | Kuriyama et al. ................... 257/369 |
| 5,789,762 | * | 8/1998 | Koyama ................................. 257/66 |
| 5,828,084 | * | 10/1998 | Nogucho et al. ....................... 257/65 |
| 5,841,153 | * | 11/1998 | Kuriyama et al. ..................... 257/69 |

FOREIGN PATENT DOCUMENTS

| | | | |
|---|---|---|---|
| 54-471 | * | 6/1982 | (EP) ..................................... 257/904 |
| 2-82570 | | 3/1990 | (JP) . |
| 2-97058 | | 4/1990 | (JP) . |
| 3-207091 | | 9/1991 | (JP) . |
| 4-322458 | | 11/1992 | (JP) . |
| 6-324753 | | 11/1994 | (JP) . |

OTHER PUBLICATIONS

Wolf and Tauber, Silicon Processing for the VLSI Era, Vol. 1–Process Technology; p. 109, 1986.*

* cited by examiner

Primary Examiner—Jerome Jackson, Jr.
Assistant Examiner—Bradley W. Baumeister
(74) Attorney, Agent, or Firm—McDermott, Will & Emery

(57) ABSTRACT

An SRAM according to the present invention includes a voltage-down circuit and an internal circuit. The voltage-down circuit includes three resistors, two PMOS transistors and an NMOS transistor. One PMOS transistor directly applies an external power supply voltage to the internal circuit. The NMOS transistor applies a voltage obtained by reducing the external power supply voltage by a threshold voltage thereof to the internal circuit. The value of a predetermined voltage as a condition for switching such application of the voltage by the PMOS transistor and application Of the voltage by the NMOS transistor is determined by the resistance ratio of the two resistors. Each of the three resistors is formed by a plurality of resistance elements of one kind. Thus, even if the process parameter varies, the ratio of the resistance values of the two resistors which determines the switching point can be kept constant, thereby preventing variation in switching point.

2 Claims, 16 Drawing Sheets

FIG.2
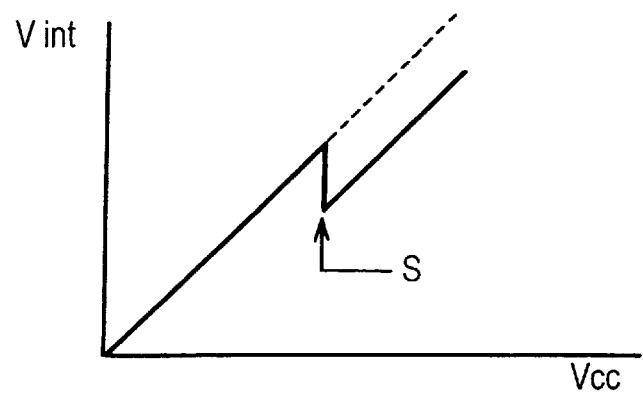
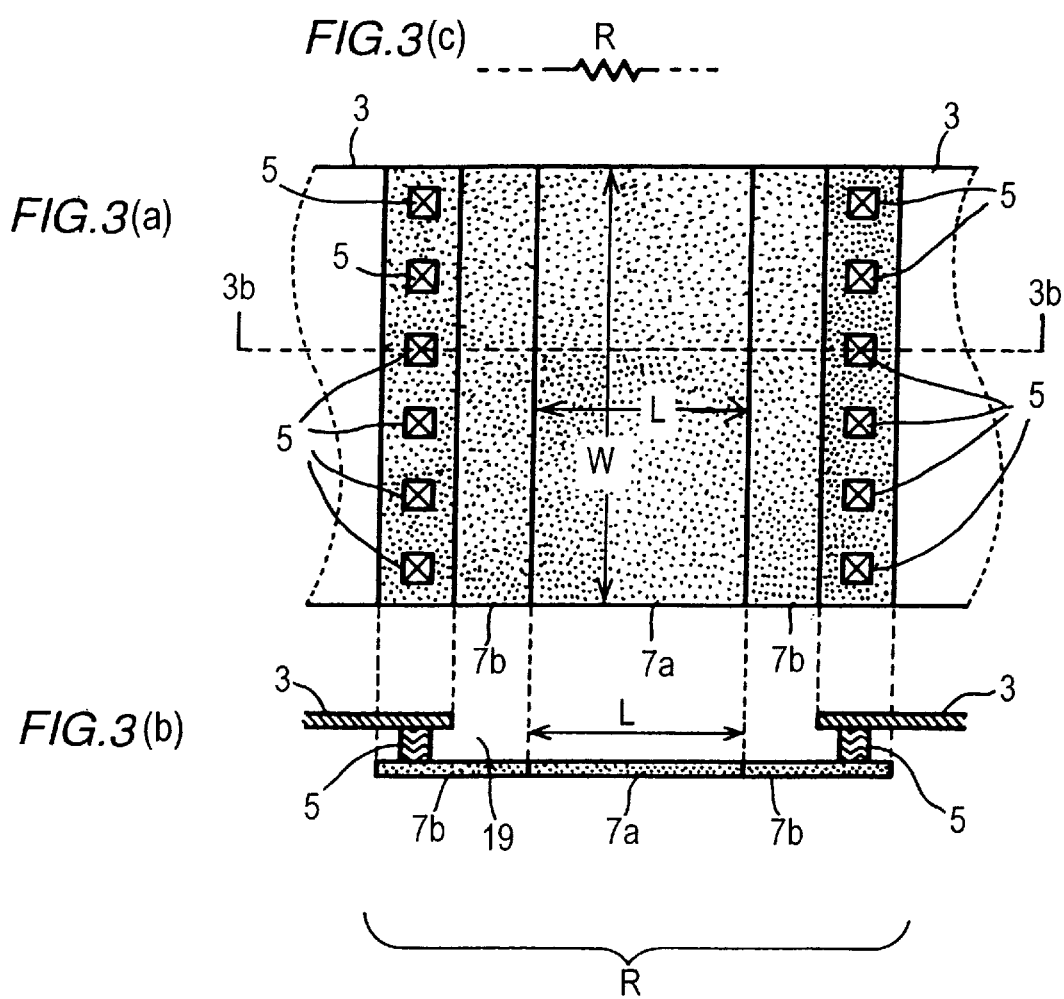
FIG.3(a)
FIG.3(b)
FIG.3(c)

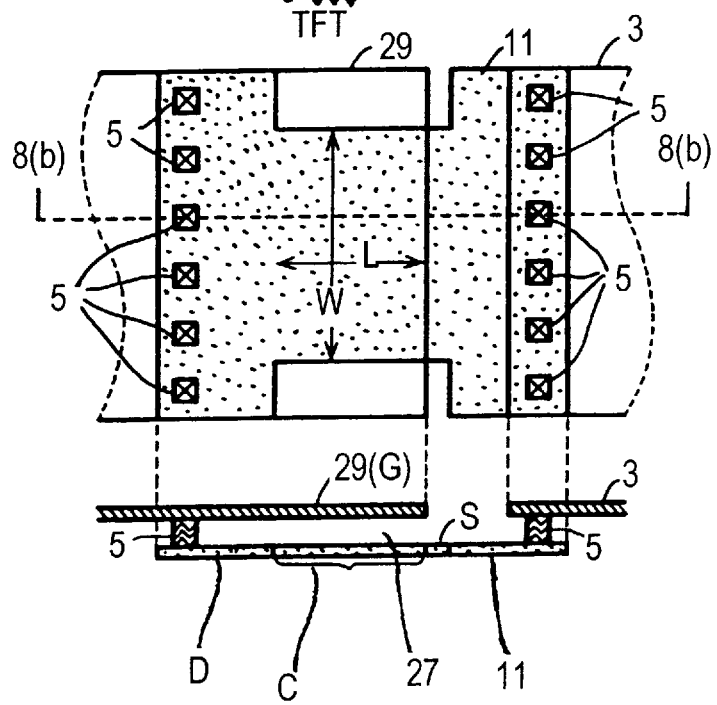

THIN FILM TRANSISTOR USED IN SEMICONDUCTOR MEMORY FOR ACHIEVING REDUCTION IN POWER CONSUMPTION

This application is a division of application Ser. No. 08/676,596, now U.S. Pat. No. 5,726,945 filed Jul. 3, 1996.

BACKGROUND OF THE INVENTION

1. Field of the Invention

The present invention relates to semiconductor memory devices having an internal voltage generation circuit and thin film transistors used therein and, more particularly, to a semiconductor memory device with reduced power consumption and a thin film transistor for achieving reduction in power consumption of a semiconductor memory device.

2. Description of the Background Art

A conventional internal voltage generation circuit which can be used in a Static Random Access Memory (hereinafter referred to as "SRAM") is disclosed, for example, Japanese Patent Laying-Open No. 3-207091. The conventional internal voltage generation circuit will be described below.

FIG. 23 is a circuit diagram showing in detail a portion of an SRAM having the conventional internal voltage generation circuit.

Referring to FIG. 23, the SRAM with the conventional internal voltage generation circuit includes an internal circuit 1 and a voltage-down circuit 57 as an internal voltage generation circuit. Voltage-down circuit 57 includes resistors R1, R2 and R3, PMOS transistors QP1 and QP2, and an NMOS transistor QN.

Resistors R1 and R2 are connected in series between a node having an external power supply voltage Vcc and a node having a ground voltage. PMOS transistor QP1 and resistor R3 are connected in series between a node having external power supply voltage Vcc and a node having the ground voltage. The gate of PMOS transistor QP1 and a node N1 are connected.

PMOS transistor QP2 is connected between a node with external power supply voltage Vcc and a node N3. PMOS transistor QP2 has a gate connected to a node N2. NMOS transistor QN is connected between a node with external power supply voltage Vcc and node N3. NMOS transistor QN has a gate connected to a node with external power supply voltage Vcc. Node N3 is connected to internal circuit 1.

Here, internal circuit 1 is such circuit as a memory circuit. Description will now be made of operation of voltage-down circuit 57.

When external power supply voltage Vcc is a low voltage of, for example, 3 V, PMOS transistor QP1 is turned off by the voltage of node N1 determined by the ratio of the resistance of resistor R1 to that of resistor R2. Node N2 has a voltage reduced to approximately 0 V by resistor R3. As a result, PMOS transistor QP2 is turned on and node N3 receives external power supply voltage Vcc of 3 V. Thus, external power supply voltage Vcc of 3 V is supplied to internal circuit 1.

In contrast, when external power supply voltage Vcc is increased to a high voltage of, for example, 5 V exceeding a predetermined voltage, PMOS transistor QP1 is turned on by the voltage of node N1. The voltage of node N2 is increased to external power supply voltage Vcc, thereby turning off PMOS transistor QP2. As a result, the voltage (current) to be applied to internal circuit 1 is all conveyed through NMOS transistor QN. Thus, internal circuit 1 receives a voltage of approximately 3.5 V obtained by reducing external power supply voltage Vcc of 5 V by a threshold voltage Vtn of NMOS transistor QN.

Thus, when external power supply voltage Vcc exceeds a predetermined voltage, a voltage is applied by NMOS transistor QN, thereby preventing application of a high voltage to internal circuit 1 to secure reliability. In addition, when external power supply voltage Vcc is decreased to a voltage lower than a predetermined voltage, a voltage is applied mainly by PMOS transistor QP2 to avoid loss of data in the memory circuit (memory cell) as internal circuit 1.

As described above, conventional voltage-down circuit 57 is capable of retaining data at a lOW voltdge and reducing a high voltage. Here, the value of the predetermined voltage (hereinafter referred to as "switching point") as a condition for turning off PMOS transistor QP2 (turning on PMOS transistor QP1) is determined mainly by the ratio of the resistance of resistor R1 to that of resistor R2.

More specifically, the condition for switching direct application of external power supply voltage Vcc to internal circuit 1 by PMOS transistor QP2 and application of the external power supply voltage Vcc which is reduced by threshold voltage Vtn to internal circuit 1 by the diode-connected NMOS transistor QN is determined mainly by the ratio of the resistance of resistor R1 to that of R2.

Resistors R1, R2 and R3 are resistance elements with high resistance which are formed of polysilicon.

As described above, conventional voltage-down circuit 57 employs one resistance element as resistor R1. The same applies to resistors R2 and R3. Therefore, in a process of fabricating resistors R1 and R2, the actual resistance value may be different from the designed resistance value due to displacement of the mask and other factors, whereby the above-described switching point cannot be determined as designed.

Furthermore, if resistance values of resistors R1–R3 are increased for reduction in consumed current in conventional voltage-down circuit 57, the response speed of voltage-down circuit 57 to external power supply voltage Vcc (the speed at which the voltage of node N1 changes in response to a change in external power supply voltage Vcc) is decreased, thereby causing malfunction of voltage-down circuit 57.

More specifically, PMOS transistor QP2 may not be turned off (PMOS transistor QP1 may not be turned on) even if external power supply voltage Vcc exceeds the above-described switching point (predetermined voltage), and PMOS transistor QP2 may not be turned on (PMOS transistor QP1 may not be turned off) even if external power supply voltage Vcc falls below the above-described switching point (predetermined voltage).

Especially, when external power supply voltage Vcc greatly changes during, for example, power-on, an abnormal ordinary voltage may be applied to internal circuit 1 because of slow response of voltage-down circuit 57 to external power supply voltage Vcc. More specifically, since voltage-down circuit 57 responds slowly to external power supply voltage Vcc, PMOS transistor QP2 is not turned off (PMOS transistor QP1 is not turned on) even when external power supply voltage Vcc exceeds the above-described switching point (predetermined voltage). As a result, external power supply voltage Vcc which is a high voltage exceeding the above-described switching point is undesirably applied to internal circuit 1.

SUMMARY OF THE INVENTION

The present invention overcomes the problems as described above, and an object thereof is to provide a semiconductor memory device having an internal voltage generation circuit capable of preventing change in switching point even if the resistance value of a resistor determining the switching point deviates from the designed resistance value.

Another object of the present invention is to provide a semiconductor memory device having an internal voltage generation circuit capable of enhancing response speed to an external power supply voltage and preventing malfunction.

Still another object of the present invention is to provide a thin film transistor capable of achieving reduction in power consumption of the thin film transistor with high resistance and of a semiconductor memory device.

The semiconductor memory device according to one aspect of the present invention relates to a semiconductor memory device provided with an internal circuit including a plurality of memory cells for storing information, which device includes a first resistance portion connected between a first line for applying a first power supply voltage and a first node, a second resistance portion connected between the first node and a second line for applying a second power supply voltage, a first transistor of a first conductivity type connected between the first line and a second node and having a control electrode connected to the first node, a third resistance portion connected between the second node and the second line, a second transistor of the first conductivity type connected between the first line and a third node and having a control electrode connected to the second node, and a transistor of a second conductivity type connected between the first line and the third node and having a control electrode connected to the first line.

The first resistance portion includes one or more first resistance elements having substantially the same resistance value and structure. The second resistance portion includes one or more second resistance elements having substantially the same resistance value and structure as the first resistance element.

The second transistor of the first conductivity type generates a first voltage to be applied to the internal circuit for the third node based on the first power supply voltage. The transistor of the second conductivity type generates for the third node a second voltage to be applied to the internal circuit based on the first power supply voltage.

The second transistor of the first conductivity type turns off when the first power supply voltage reaches a predetermined voltage and stops generation of the first voltage. The value of the predetermined voltage as a condition for turning off the second transistor of the first conductivity type is determined by a ratio of the resistance value of the first resistance portion to that of the second resistance portion (the resistance value of the first resistance portion: the resistance value of the second resistance portion).

In the semiconductor memory device according to the first aspect, the first and second resistance elements of one kind, i.e. having the same resistance value and structure are employed and the first resistance portion is formed by the first resistance element and the second resistance. portion is formed by the second resistance element. Thus, in a process for manufacturing the first and second resistance portions, when the resistance values of the first and second resistance elements change from the designed value because of change in process parameter, the resistance values of the first and second resistance elements change at the same rate.

Consequently, in the semiconductor memory device according to the first aspect, change in ratio of the resistance value of the first resistance portion to that of the second resistance portion can be prevented even if process parameter changes. More specifically, the value of the predetermined voltage at which the second transistor of the first conductivity type is turned off is prevented from changing due to a change in process parameter.

In the semiconductor memory device according to the first aspect, the first and second resistance elements of one kind are employed to form the first resistance portion by the first resistance element and the second resistance portion by the second resistance element.

As a result, in the semiconductor memory device according to the first aspect, layout can be easily made with a CAD. In addition, correction of the layout due to a change in design and the like can also be easily made with a CAD.

In the semiconductor memory device according to the first aspect, the resistance value of the first resistance portion is adjusted by the number of the first resistance elements connected, and the resistance value of the second resistance portion is adjusted by the number of the second resistance elements connected. In other words, the ratio of the resistance value of the first resistance portion to that of the second resistance portion is adjusted by the number of the first and second resistance elements connected. This means that the ratio of the resistance value of the first resistance portion to that of the second resistance portion is set taking into consideration all the components constituting the first and second resistance elements.

Consequently, in the semiconductor memory device according to the first aspect, the ratio of the resistance value of the first resistance portion to that of the second resistance portion can be set accurately and easily.

The semiconductor memory device according to a second aspect of the present invention relates to a semiconductor memory device provided with an internal circuit having a plurality of memory cells for storing information, which device includes a first resistance portion connected between a first line for applying a first power supply voltage and a first node, a second resistance portion connected between the first node and a second line for applying a second power supply voltage, a first transistor of a first conductivity type connected between the first line and a second node and having a control electrode connected to the first node, a third resistance portion connected between the second node and the second line, a second transistor of the first conductivity type connected between the first line and a third node and having a control electrode connected to the second node, a transistor of a second conductivity type connected between the first line and the third node and having a control electrode connected to the first line, a first capacitance portion connected between the first line and the first node, and a second capacitance portion connected between the first node and the second line.

The second transistor of the first conductivity type generates a first voltage to be applied to the internal circuit for the third node based on the first power supply voltage. The transistor of the second conductivity type generates a second voltage to be applied to the internal circuit for the third node based on the first power supply voltage.

The second transistor of the first conductivity type turns off when the first power supply voltage becomes equal to a predetermined voltage and stops generation of the first voltage. The value of the predetermined voltage as the condition for turning off the second transistor of the first conductivity type is determined by a first ratio of the resistance value of the first resistance portion to that of the second resistance portion (the resistance value of the first resistance portion: the resistance value of the second resistance portion).

A second ratio of the capacitance value of the second capacitance portion to that of the first capacitance portion (the capacitance value of the second capacitance portion: the capacitance value of the first capacitance portion) is equal to the first ratio.

In the semiconductor memory device according to the second aspect, the first and second capacitance portions are provided, so that, when the first power supply voltage makes a rapid change, the voltage of the first node can be set at a desired voltage without lagging behind the rapid change.

Consequently, in the semiconductor memory device according to the second aspect, turn on/off of the first and second transistors of the first conductivity type can be controlled as intended even when the first power supply voltage changes rapidly, so that the first or second voltage can be applied to the internal circuit as intended.

The semiconductor memory device according to a third aspect of the present invention relates to a semiconductor memory device having an internal circuit connected to an internal power supply line, which includes a first pad and an input protection circuit for protecting the internal circuit from an unexpected voltage input. The first pad is connected to the internal power supply line through the input protection circuit.

In the semiconductor memory device according to the third aspect, the input protection circuit is provided between the internal power supply line and the first pad.

As a result, in the semiconductor memory device according to the third aspect, breakdown of the internal circuit can be prevented even when an unexpected great voltage is applied to the first pad.

A thin film transistor according to a fourth aspect of the present invention relates to a thin film transistor for use in a semiconductor memory device, which transistor includes first and second conductive layers and an insulating layer formed between the first and second conductive layers.

The first conductive layer includes a control electrode. The second conductive layer includes first and second electrodes. The thickness of the insulating layer is greater than that of a control electrode insulating film of the thin film transistor used as a load element in a memory cell of the semiconductor memory device.

In the thin film transistor according to the fourth aspect, the insulating layer has a thickness greater than that of the control electrode insulating film of the thin film transistor used as a load element in a memory cell, so that, when a current transistor is turned on, a current flowing between the first and second electrodes is smaller than the current in the thin film transistor used as a load element in a memory cell. In other words, in the thin film transistor according to the fourth aspect, the on-resistance is greater than the resistance of the thin film transistor used as a load element in a memory cell.

As a result, by using the thin film transistor according to the fourth aspect, the required number of resistors having a desired resistance value for achieving reduction in power consumption of the semiconductor memory device is reduced as compared to the case where a thin film transistor used as a load element is employed in a memory cell.

In the thin film transistor according to the fourth aspect, the insulating layer has a thickness greater than the control electrode insulating film of the thin film transistor used as a load element in a memory cell, so that the electric field between the first and second conductive layers can be relaxed.

Consequently, the thin film transistor according to the fourth aspect can be used in a circuit receiving an unreduced voltage without degradation in reliability of the thin film transistor.

The thin film transistor according to a fifth aspect of the present invention relates to a thin film transistor for use in a semiconductor memory device, which transistor includes first and second conductive layers and an insulating layer formed between the first and second conductive layers.

The first conductive layer includes a control electrode. The second conductive layer includes first and second electrodes. The first conductive layer is constituted by a metal interconnection layer formed simultaneously with any metal interconnection layer used as a signal interconnection.

In the thin film transistor according to the fifth aspect, since the first conductive layer is constituted by a metal interconnection layer formed simultaneously with any metal interconnection layer used as a signal interconnection, the first conductive layer can be formed by utilizing a part of the existing steps of manufacturing a semiconductor memory device.

Thus, in the thin film transistor according to the first aspect, the first conductive layer can be formed without an additional manufacturing step to suppress increase in cost.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a diagram for describing operation of a voltage-down circuit in FIG. 1.

FIGS. 3a–3c is a diagram showing a structure of a polysilicon high resistance element as a resistance element R in FIG. 1.

FIGS. 7a–7d is a diagram showing in detail a structure of a TFT in FIG. 6.

FIGS. 8a–8c is a diagram showing in detail a structure of a TFT used as a resistor in a voltage-down circuit of an SRAM according to a third embodiment of the present invention.

DESCRIPTION OF THE PREFERRED EMBODIMENTS

Now, a Static Random Access Memory (hereinafter referred to as an "SRAM") as a semiconductor memory device according to the present invention will be described with reference to the drawings. Since the feature of the SRAM of the present invention lies in an internal voltage generation circuit, description below will be made mainly on the internal voltage generation circuit.

Embodiment 1

Figure 23:
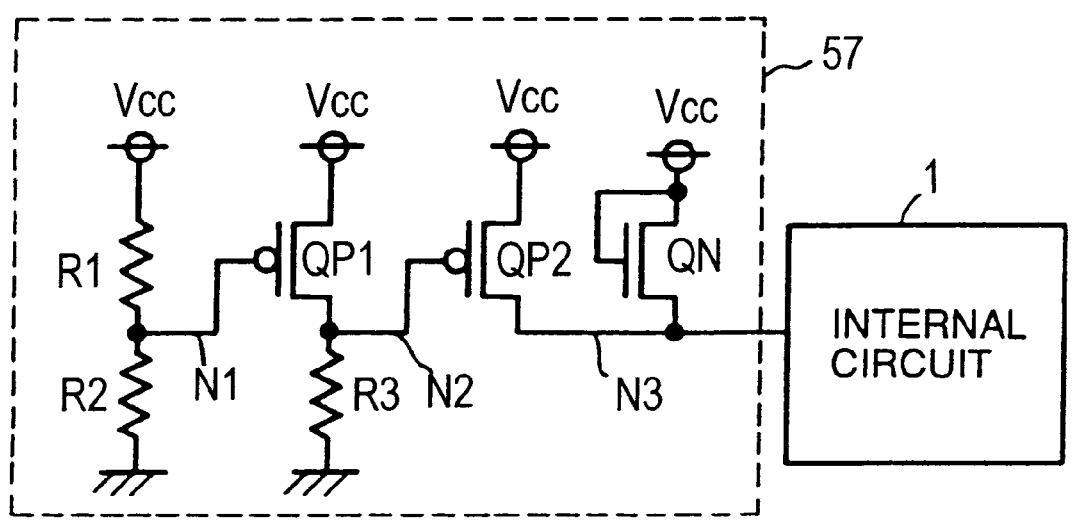
FIG. 23 is a circuit diagram showing in detail a part of an SRAM having a voltage-down circuit as a conventional internal voltage generation circuit.

The internal voltage generation circuit of the SRAM according to a first embodiment of the present invention is different from voltage-down circuit (internal voltage generation circuit) 57 shown in FIG. 23 in the following point. While resistors R1, R2, and R3 of the conventional voltage-down circuit 57 shown in FIG. 23 are each formed by one resistance element, each resistor of the internal voltage generation circuit of the SRAM according to the first embodiment of the present invention is formed by a plurality of resistance elements having the same resistance value and structure.

Figure 1:
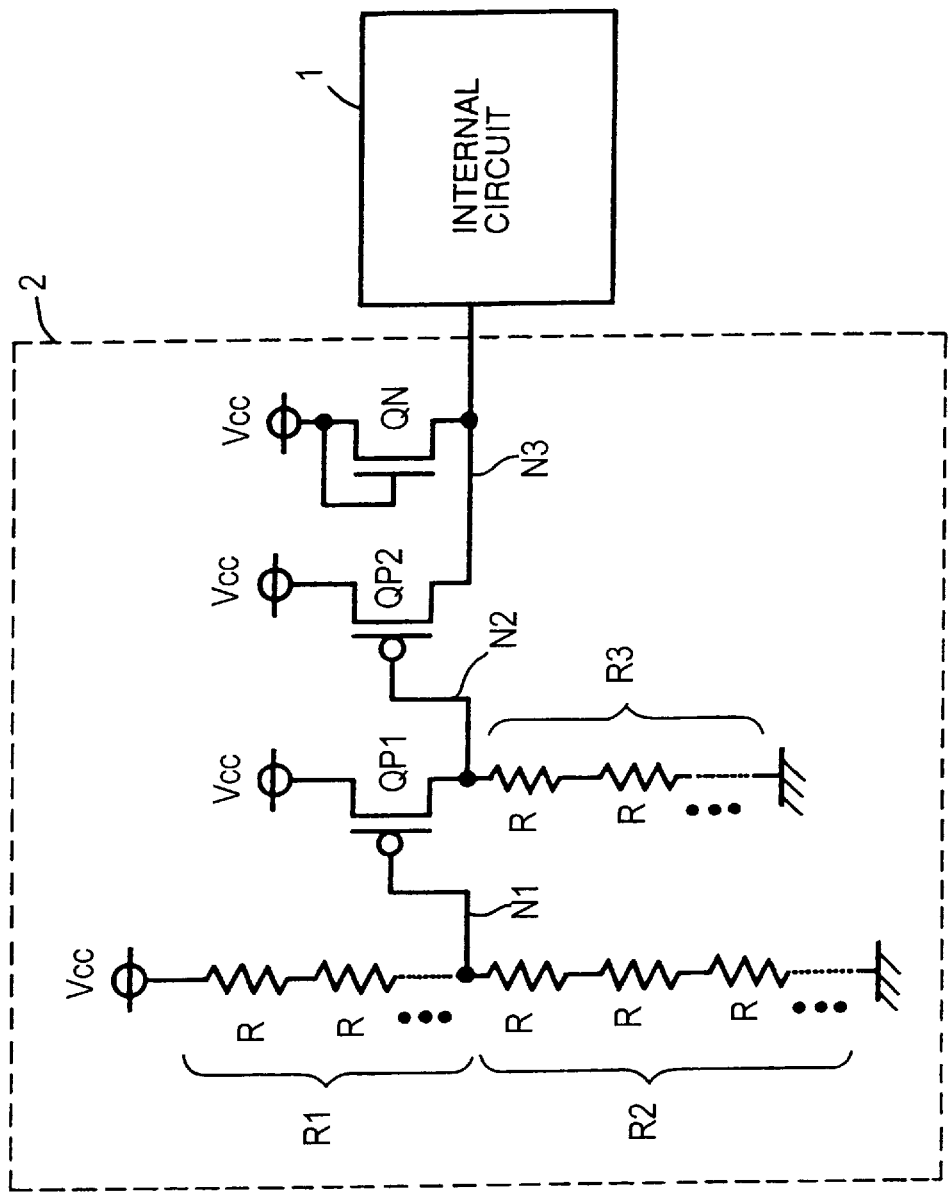
FIG. 1 is a circuit diagram showing in detail a part of an SRAM according to a first embodiment of the present invention.

FIG. 1 is a circuit diagram showing in detail a part of the SRAM according to the first embodiment of the present invention.

Referring to FIG. 1, a part of the SRAM according to the first embodiment includes an internal circuit 1 and a voltage-down circuit 2 as an internal voltage generation circuit. Voltage-down circuit 2 includes resistors R1, R2, and R3, PMOS transistors QP1 and QP2, and NMOS transistor QN. Resistor R1 includes m resistance elements R. Resistor R2 includes n resistance elements R. Resistor R3 includes k resistance elements R.

Resistors R1 and R2 are connected in series between a node having external power supply voltage Vcc and a node having a ground voltage. The m resistance elements R are connected in series between a node with external power supply voltage Vcc and a node N1. The n resistance elements R are connected in series between node N1 and a node with the ground voltage.

PMOS transistor QP1 and resistor R3 are connected in series between a node with external power supply voltage Vcc and a node with the ground voltage. The gate of PMOS transistor QP1 and node N1 are connected. The k resistance elements R are connected in series between a node N2 and a node with the ground voltage.

PMOS transistor QP2 is connected between a node with external power supply voltage Vcc and a node N3. The gate of PMOS transistor QP2 is connected to node N2. NMOS transistor QN is connected between a node with external power supply voltage Vcc and node N3, and has a gate connected to the node with external power supply voltage Vcc. Node N3 is connected to internal circuit 1.

Internal circuit 1 is, for example, a memory circuit having a plurality of memory cells for storing information. The m resistance elements R forming resistor R1, n resistance elements R forming resistor R2, and k resistance elements R forming resistor R3 have substantially the same resistance value. All the resistance elements R have substantially the same structure.

First, description will be made of general operation of voltage-down circuit 2. When external power supply voltage Vcc is a voltage of, for example, 3 V which is lower than a predetermined voltage, PMOS transistor QP1 is turned off by the voltage of node N1 which is determined by the ratio of the resistance value of resistor R1 to that of resistor R2. As a result, the voltage of node N2 is reduced to a voltage as low as approximately 0 V by resistor R3, and PMOS transistor QP2 is turned on. Consequently, external power supply voltage Vcc is applied to node N3 through PMOS transistor QP2. In other words, internal circuit 1 receives external power supply voltage Vcc as an internal voltage mainly through PMOS transistor QP2.

In contrast, when external power supply voltage Vcc is a high voltage of, for example, 5 V exceeding the predetermined voltage, PMOS transistor QP1 is turned on by the voltage of node N1. As a result, the voltage of node N2 is increased reaching close to external power supply voltage Vcc, thereby turning off PMOS transistor QP2. Thus, the voltage (current) to be supplied to internal circuit 1 is all conveyed through NMOS transistor QN. In other words, a voltage of approximately 3.5 V obtained by reducing external power supply voltage Vcc of 5 V by a threshold voltage Vtn of NMOS transistor QN is applied.

The value of the predetermined voltage (hereinafter referred to as a "switching point") as a condition for turning off PMOS transistor QP2 (turning on PMOS transistor QP1) is determined by the ratio of the resistance of resistor R1 to that of resistor R2. More specifically, the value of the predetermined voltage (switching point) as the condition for switching direct application of external power supply voltage Vcc to internal circuit 1 by PMOS transistor QP2 and application of a voltage reduced from external power supply voltage Vcc by threshold voltage Vtn of NMOS transistor QN to internal circuit 1 by NMOS transistor QN is determined mainly by the ratio of the resistance value of resistor R1 to that of resistor R2.

FIG. 2 is a diagram for describing operation of voltage-down circuit 2 shown in FIG. 1.

Referring to FIG. 2, the horizontal axis indicates external power supply voltage Vcc and the vertical axis indicates the voltage of node N3 (hereinafter referred to as "internal voltage Vint"). When external power supply voltage Vcc is lower than switching point (predetermined voltage) S, PMOS transistor QP2 is on and internal voltage Vint is applied to internal circuit 1 mainly by PMOS transistor QP2, When external power supply voltage Vcc is higher than switching point (predetermined voltage) S, PMOS transistor QP2 is off and internal voltage Vint is applied to internal circuit 1 by NMOS transistor QN.

Thus, voltage down-circuit 2 directly applies external power supply voltage Vcc to internal circuit 1 as internal voltage Vint through PMOS transistor QP2 when external power supply voltage Vcc is lower than switching point S. When external power supply voltage Vcc is higher than switching point S, internal voltage Vint which is the reduced version of external power supply voltage Vcc is applied to internal circuit 1 by NMOS transistor QN. The broken line indicates the case where external power supply voltage Vcc is not reduced and generated as internal voltage Vint (the case where switching point S is not present).

Next, a feature of voltage-down circuit 2 of the SRAM according to the first embodiment of the present invention will be described. Voltage-down circuit 2 according to the first embodiment is characterized in that only the resistance elements R of one kind (having substantially the same resistance value and substantidlly the same structure) are employed and three resistors R1, R2, and R3 are each formed by providing one or more resistance elements R, as described above. It is assumed that the resistance value of resistor R1 is represented as R1, the resistance value of the resistor R2 and R2, the resistance value of resistor R3 as R3, and the resistance value of resistance element R as R. In FIG. 1, R1=m×R, R2=n×R, and R3=k×R. The characters m, n, and k represent the number of resistance elements included in resistors R1, R2, and R3, respectively, and are natural numbers.

Thus, resistors R1–R3 are formed by providing one or more resistance elements R of one kind, so that layout with a CAD (Computer Aided Design) is made easily. In addition, correction of the layout due to change in design can also be made easily with a CAD.

In addition, in a process for forming resistors R1–R3, the circuit is more immune to the change in process parameter. More specifically, in the process for forming resistance elements R1–R3, even if the resistance value of resistance element R changes (if the resistance value of resistance element R is different from the designed resistance value) due to, for example, displacement of the mask, the resistance values of all the resistance elements R change at the same rate. For example, the resistance value R of all the resistance elements R all change to resistance value R'. Therefore, the ratio of resistance value R1 of resistor R1 to resistance value R2 of resistor R2 (R1:R2) which determines the switching point which is the most important factor in voltage-down circuit 2 is constant as represented in the following equation even if resistance value R of resistance element R changes to resistance value R'.

$$R1:R2$$
$$=m\times R':n\times R'$$
$$=m:n \quad (1)$$

Generally, threshold voltage Vtp of PMOS transistor QP1 is often close to 0.8 V. Thus, by setting the ratio R1:R2= m:n=1:2–1:5, PMOS transistor QP2 is turned off and NMOS transistor QN generates internal voltage Vint to be supplied to internal circuit 1 when external power supply voltage Vcc is 5 V. When external power supply voltage Vcc is 3 V, PMOS transistor QP2 is turned on and external power supply voltage Vcc of 3 V can be directly applied to internal circuit 1 as internal voltage Vint by setting ratio R1:R2= m:n=1:2–1:5.

In other words, in normal operation of the SRAM such as reading/writing, internal voltage Vint obtained by reducing external power supply voltage Vcc of 5 V is applied to internal circuit 1. When the SRAM holds data, external power supply voltage Vcc of 3 V can be directly applied to internal circuit 1 as the internal voltage.

Since a plurality of resistance elements R of one kind (having substantially the same resistance value and substantially the same structure) are provided to form resistors R1–R3, the ratio of resistance value R1 of resistor R1 to resistance value R2 of resistor R2 (R1:R2) can be determined easily. This will be described in detail below.

Let us consider a case where a resistance element having a high resistance and formed of polysilicon (hereinafter referred to as a "polysilicon high resistance element") is employed as resistance element R in FIG. 1. First, description will be made of a general polysilicon high resistance element. When polysilicon is actually used as a resistance element in a circuit, the polysilicon must be connected to a metal interconnection (metal signal interconnection) through a contact hole or the like. Description will be made with reference to the drawings.

FIG. 3 is a diagram showing a structure of a polysilicon high resistance element as resistance element R in FIG. 1. In FIG. 3, (a) is a plan view of a polysilicon high resistance element and (b) shows a cross section taken along the line A–A' in (a).

Referring to FIG. 3, the polysilicon high resistance element used as resistance element R is formed by a metal interconnection 3, a contact hole 5, and a polysilicon 7. Polysilicon 7 is formed by a polysilicon (resistance portion) 7a and a polysilicon (interconnection portion) 7b. Polysilicon (interconnection portion) 7b is connected to metal interconnection 3 through contact hole 5 formed at an insulating film 19 such as an oxide film. A conductive layer of metal or the like is formed in contact hole 5.

Polysilicon (resistance portion) 7a and polysilicon (interconnection portion) 7b integrally form polysilicon 7. Polysilicon (interconnection portion) 7b is different from polysilicon (resistance portion) 7a in that the resistance value thereof is reduced by introducing impurity thereto. Thus, the polysilicon resistance element as resistance element R is formed by connecting polysilicon 7 to metal interconnection 3 through contact hole 5.

Generally, the resistance value of polysilicon (resistance portion) 7a is directly proportional to its length L and inversely proportional to its width W. Therefore, the resistance value of polysilicon (resistance portion) 7a is determined by value L/W of the length L to width W ratio (L:W).

Accordingly, the resistance of the polysilicon high resistance element as resistance element R is adjusted by changing length L and width W of polysilicon (resistance portion) 7a. Here, since polysilicon (resistance portion) 7a is connected to polysilicon (interconnection portion) 7b and metal internal interconnection 3 through contact hole 5, not only the resistance value of polysilicon (resistance portion) 7a but also the resistance values of polysilicon (interconnection portion) 7b, contact hole 5, and the like are included in the resistance value of the polysilicon high resistance element used as resistance element R.

It is now assumed that the polysilicon high resistance element shown in FIG. 3 is used as resistors R1 and R2 of the conventional voltage-down circuit 57 shown in FIG. 23. The length and the width of the polysilicon (resistance portion) of resistor R1 will be indicated as L1 and W1, and those of the polysilicon (resistance portion) of resistor R2 will be indicated as L2 and W2, respectively.

If external power supply voltage Vcc is divided in accordance with the ratio of resistance value R1 of resistor R1 to resistance value R2 of resistor R2 (R1:R2, hereinafter referred to as the "R1:R2 resistance ratio"), value L1/W1 of L1:W1 and value L2/W2 of L2:W2 are adjusted to obtain a desired R1:R1 resistance ratio. That is, the value of L1/W1:L2/W2 is matched with the value of the desired R1:R2 resistance value. In other words, the value of (the resistance value of polysilicon (resistance portion) 7a of resistor R1); (the resistance value of polysilicon (resistance portion) 7a of resistor R2) is matched with the value of the desired R1:R2 resistance ratio.

However, the resistance values of contact hole 5 and polysilicon (interconnection portion) 7b should also be included in the resistance values of resistors R1 and R2 as described above. The actual R1:R2 resistance ratio will not be made equal to the desired R1:R2 resistance ratio only by matching the value of L1/W1:L2/W2 to the desired R1:R2 resistance ratio.

For example, when width W1 is equal to W2 and the desired R1:R2 resistance ratio is 1:5, the actual R1:R2 resistance ratio is different from the desired R1:R2 resistance ratio of 1:5 even with (L1/W1):(L2/W2)=L1:L2=1:5.

Therefore, as shown in FIG. 3, resistance element R as resistors R1 and R2 includes contact hole 5 and polysilicon (interconnection portion) 7b in voltage-down circuit 2 of the SRAM according to the first embodiment. In other words, contact hole 5, polysilicon (interconnection portion 7b), and the like integrally form resistance element R.

Furthermore, resistors R1 and R2 are formed by a plurality of resistance elements R of one kind (having substantially the same resistance value and structure) in voltage-down circuit 2 of the SRAM according to the first embodiment as shown in FIG. 1.

Therefore, in voltage-down circuit 2 of the SRAM according to the first embodiment, the desired R1:R2 resistance ratio of, for example, 1:5 is obtained by providing one resistance element R as resistor R1 and five resistance elements R as resistor R2. Since the resistance values of contact hole 5 and polysilicon (interconnection portion) 7b are also taken into consideration, the actual R1:R2 resistance ratio is substantially equal to the desired R1:R2 resistance ratio of 1:5.

An accurate R1:R2 resistance ratio can be obtained by providing resistance elements R of one kind as in voltage-down circuit 2 of the SRAM according to the first embodiment. It is to be noted that the resistance value of metal interconnection 3 is significantly small as compared to those of polysilicon 7 and contact hole 5, and therefore need not be considered.

Figure 4:
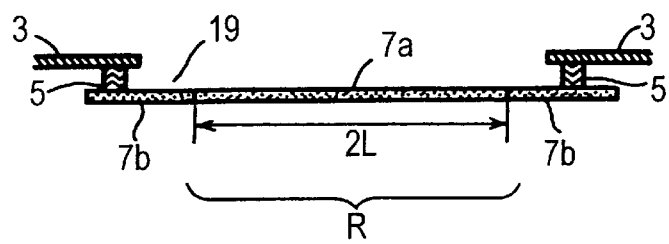
FIG. 4 is a diagram for describing a method of adjusting resistance value of a general resistor.

FIG. 4 is a diagram for describing a method of adjusting the resistance value of a general resistor. The portions similar to those in FIG. 3 are labeled with the identical reference numerals and description thereof will not be repeated.

In general, if width w of polysilicon (resistance portion) 7a is constant, the resistance value of the resistor is adjusted by changing length L. For example, with reference to FIG. 4, the resistance value of the resistor having polysilicon (resistance portion) 7a with length L is doubled by increasing the length of polysilicon (resistance portion) 7a to 2L, twice as long as length L. However, the resistance value actually obtained is smaller than the doubled resistance because the resistance values of contact hole 5 and polysilicon (interconnection portion) 7b remain unchanged. Therefore, only polysilicon (resistance portion) 7a is considered as resistance element R in a general resistor. The resistance value of each resistor R1–R3 in voltage-down circuit 57 shown in FIG. 23 is thus adjusted.

Figure 5:
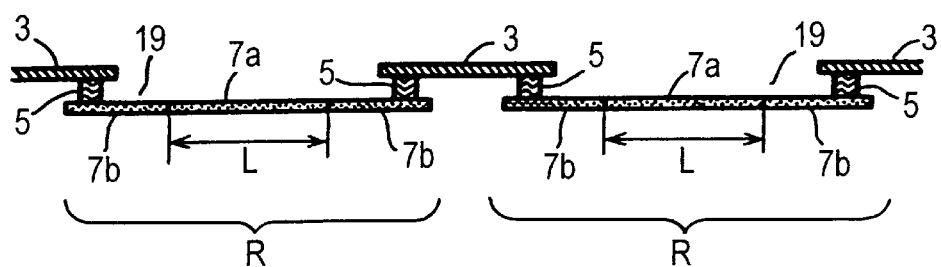
FIG. 5 is a diagram for describing a method of adjusting resistance value of resistor R1 or R2 in the voltage-down circuit of FIG. 1.

FIG. 5 is a diagram for describing a method of adjusting the resistance value of resistor R1 or R2 in voltage-down circuit 2 shown in FIG. 1. The portions similar to those in FIG. 3 are labeled with the identical reference numerals and description thereof will not be repeated.

The resistance value of each resistor R1, R2 in voltage-down circuit 2 is adjusted by the number of resistance elements R of one kind (having substantially the same resistance value and structure) provided to form the resistor. For example, the resistance value of resistor R1 formed by one resistance element R having polysilicon (resistance portion) 7a of length L is doubled by providing two resistance elements R including contact hole 5 and polysilicon (interconnection portion) 7b. Thus, the resistance value can be surely doubled since the contact hole 5 and polysilicon (interconnection portion) 7b are also doubled.

As described above, resistors R1–R3 are formed by providing resistance elements R of one kind (the resistance value and structure thereof are substantially the same) in the voltage-down circuit of the SRAM according to the first embodiment.

Therefore, the R1:R2 resistance ratio which is the most important factor in voltage-down circuit 2 can be kept constant even if the process parameter changes in the process for forming resistors R1–R3. More specifically, even if the resistance values of resistors R1 and R2 which determine the switching point is shifted from the designed resistance value due to a change in process parameter, change in switching point can be prevented.

Since resistance elements R of only one kind (having substantially the same resistance value and structure) are used, layout can be easily made with a CAD and correction of the layout due to a change in design can also be easily made.

By setting the R1:R2 resistance ratio R1:R2 at 1:2–1:5, the conditions of using an SRAM with reduced power consumption can be satisfied (external power supply voltage Vcc of 3 V is not reduced and the voltage of 3 V is applied to the memory circuit as internal circuit 1 for holding data, and the voltage obtained by reducing external power supply voltage Vcc of 5 V is applied to internal circuit 1 in normal operation).

The set of contact hole 5 and polysilicon (interconnection portion) 7b in addition to polysilicon (resistance portion) 7a are regarded as resistance element R, and resistors R1–R3 are each formed by providing one or more resistance elements R. More specifically, the resistance value of each resistor R1–R3 is adjusted by providing one or more resistance elements R of one kind (having substantially the same resistance value and structure), taking into consideration the resistance values of contact hole 5 and polysilicon interconnection portion 7b as well as the resistance value of polysilicon (resistance portion) 7a. As a result, the R1:R2 resistance ratio, the most important factor in voltage-down circuit 2, can be set accurately and easily.

Power consumption of the entire SRAM can be reduced by providing resistors R1–R3 with high resistance.

Embodiment 2

Polysilicon high resistance elements are employed as resistors R1–R3 in voltage-down circuit 57 shown in FIG. 23, which brings about the following problem. Since the polysilicon high resistance element is not used as a load element of a memory cell in an SRAM recently, it is difficult to form the polysilicon high resistance element in the process for manufacturing an SRAM. In a recent SRAM with a large capacity of 1M or 4M with reduced power consumption, a thin film transistor (hereinafter referred to as a "TFT"), not the polysilicon high resistance element, is used as a load element of a memory cell. Therefore, there is no step of forming the polysilicon high resistance element and use of such polysilicon high resistance element in a voltage-down circuit increases the number of steps in the process of manufacturing an SRAM, leading to an increase in cost. A voltage-down circuit of an SRAM according to a second embodiment overcomes such problem.

In the voltage-down circuit of the SRAM according to the second embodiment, one or more TFTs are employed as one or more resistance elements R for forming each of resistors R1–R3 in voltage-down circuit 2 of FIG. 1. Therefore, the polysilicon high resistance element is not used as resistance element R.

Figure 6:
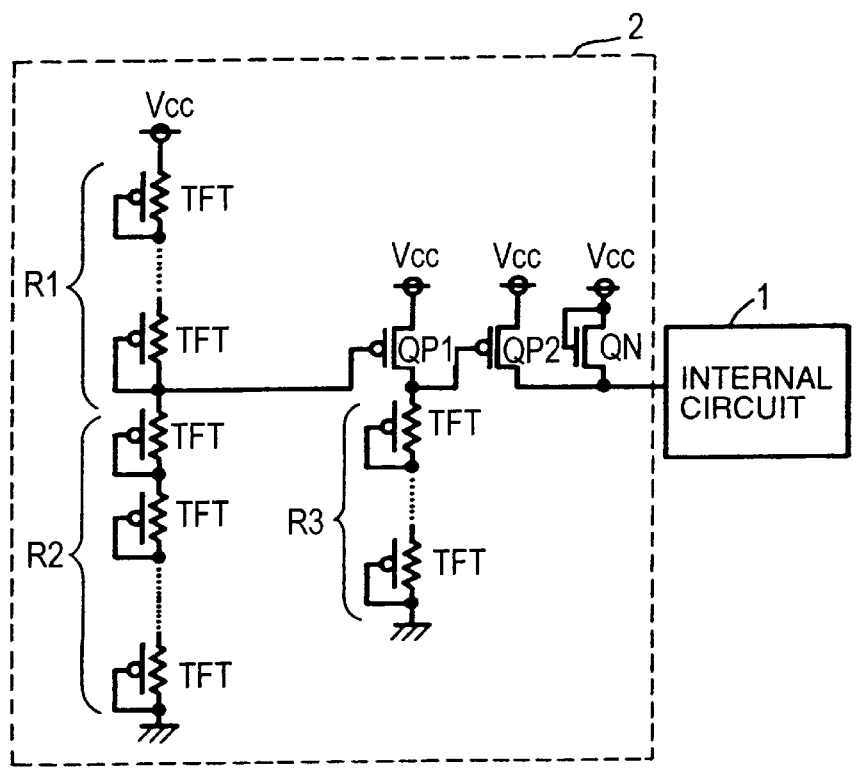
FIG. 6 is a circuit diagram showing in detail a part of an SRAM according to a second embodiment of the present invention.

FIG. 6 is a circuit diagram showing in detail a part of the SRAM according to the second embodiment of the present invention. The portions similar to those in FIG. 1 are indicated by the same reference numerals and description thereof will not be repeated.

Each of resistors R1, R2, and R3 is formed by one or more TFTs of one kind (having substantially the same resistance value and structure). Therefore, TFTs are employed as resistance elements R in FIG. 1.

FIG. 7 is a diagram showing in detail a structure of a TFT shown in FIG. 6. In FIG. 7, (a) is a plan view of a TFT and (b) shows a cross section taken along the line A–A'.

Referring to FIG. 7, a TFT is formed by polysilicons 9 and 11 and a gate insulating film 17. Polysilicon 9 includes a drain D, a channel C, and a source S. A gate G forms a part of polysilicon 11. Gate insulating film 17 is such a film as a gate oxide film. When TFTs are employed as resistance elements forming resistors R1–R3, the set of metal interconnection 3, contact holes 5, 21 and 23, polysilicons 9, 11 and 13, and gate insulating film 17 are regarded as a TFT.

Gate insulating film 17 is formed on polysilicon 11. Polysilicon 9 is formed on gate insulating film 17. Polysilicon 9 has drain D connected to polysilicon 11 through contact hole 21. A conductive layer is formed by polysilicon in contact hole 21.

Polysilicon 9 has source S connected to polysilicon 13 through contact hole 23. A conductive layer is formed by poly5ilicQn in contact hole 23. Polysilicon 11 and metal interconnection 3 are connected by contact hole 5 formed at an insulating film 19. A conductive layer is formed of metal in contact hole 5. Polysilicon 13 and metal interconnection 3 are connected through contact hole 5 formed at insulating film 19. A conductive layer is formed of metal in contact hole 5. Insulating film 19 is, for example, an oxide film, and an isolation insulating film 15 is, for example, an isolation oxide film.

It is now assumed that TFTs shown in FIG. 7 are used as resistors R1–R3 of voltage-down circuit 57 in FIG. 23. In such a case, in order to establish a ratio of resistance value R1 of resistor R1 to resistance value R2 of resistor R2 (hereinafter referred to as a "R1:R2 resistance ratio") as desired, the resistance values of resistors R1 and R2 are adjusted by changing channel length L if channel width W is constant. It should be noted that the resistance value of a TFT is regarded as directly proportional to channel length L and inversely proportional to channel width W in this case.

However, if the R1:R2 resistance ratio is thus set, the resistance values of contact holes 5, 21 and 23 and polysilicons 11 and 13 are not taken into consideration. Therefore, if, for example, channel length L is doubled to 2L so that the resistance value of resistor R1 or R2 is doubled, the actual resistance value obtained is smaller than the value twice as great as the original resistance value. As a result, it is difficult to set the R1:R2 resistance ratio to a desired ratio.

In contrast, in voltage-down circuit 2 of the SRAM according to the second embodiment, a TFT as a resistance element for forming resistor R1–R3 is regarded to be formed by the integral body of contact holes 5, 21 and 23, polysilicons 11, 9 and 13, metal interconnection 3, and gate insulating film 17. The resistance values of resistors R1–R3 are adjusted by changing the number of TFTs of one kind (the resistance value and structure thereof are substantially the same).

Accordingly, since the resistance values of contact holes 5, 21 and 23, polysilicons 11 and 13, and the like form a part of the resistance value of each TFT, the resistance value can be surely doubled by doubling the number of TFTS. Thus, the R1:R2 resistance ratio can be accurately and easily set as desired.

As described above, one or more TFTs of one kind (having substantially the same resistance value and structure) are employed to form each of resistors R1–R3 in voltage-down circuit 2 of the SRAM according to the second embodiment. In other words, in the voltage-down circuit of the SRAM according to the second embodiment, a TFT is used as resistance element R of the voltage-down circuit (FIG. 1) of the SRAM according to the first embodiment. Therefore, the effects similar to those of the SRAM according to the first embodiment can be obtained by the SRAM according to the second embodiment.

In the voltage-down circuit of the SRAM according to the second embodiment, contact holes 5, 21 and 23, polysilicons 11, 9 and 13, metal interconnection 3 and gate insulating film 17 integrally form a TFT as a resistance element forming resistor R1–R3, the resistance values of contact holes 5, 21 and 23 and polysilicons 11 and 13, as well as the resistance value of polysilicon 9 are included in the resistance value of a TFT. In other words, each of resistors R1–R3 is formed by providing one or more.TFTs of one kind (having substantially the same resistance value and structure, taking into account the resistance values of contact holes 5, 21 and 23 and polysilicons 11 and 13. As a result, the R1:R2 resistance ratio can be accurately and easily set at a desired ratio in the voltage-down circuit of the SRAM according to the second embodiment.

The SRAM according to the second embodiment provides the effects similar to those of the SRAM according to the first embodiment by setting the R1:R2 resistance ratio at 1:2–1:5.

A TFT used as a load element of a memory cell is utilized as resistors R1–R3 of the voltage-down circuit 2 of the SRAM according to the second embodiment. Therefore, in the SRAM according to the second embodiment, the additional step of forming resistors R1–R3 is not required, suppressing increase in number of steps of the manufacturing process of the SRAM and avoiding increasing in cost.

Embodiment 3

An SRAM according to a third embodiment of the present invention differs from the SRAM according to the second embodiment in structure of a TFT as a resistance element used in a voltage-down circuit. Therefore, a portion of the SRAM according to the third embodiment is the same as a portion of the SRAM according to the second embodiment shown in FIG. 6.

The conditions for reducing power consumption of the entire SRAM when a TFT is used as a resistance element of a voltage-down circuit will be described with specific examples. In an SRAM where reduced power consumption is required, the consumed current thereof must be suppressed to 1 $\mu$A or lower in the standby state when the external power supply voltage is 3 V. In a voltage-down circuit for use in such an SRAM, the current consumed by the voltage-down circuit itself must also be suppressed.

Description will be made taking as an example voltage-down circuit 2 of the SRAM according to the first embodiment shown in FIG. 1. It is assumed that the external power supply voltage is 3 V, the ratio of resistance value R1 of resistor R1 to resistance value R2 of resistor R2 (hereinafter referred to as a "R1:R2 resistance ratio") is 1:3, and a current consumed by voltage-down circuit 2 itself is 0.001 $\mu$A or smaller. In such a case, if resistor R1 is formed by one resistance element R and resistor R2 is formed by three resistance elements R, resistance value R of one resistance element R is required to be close to 750 M$\Omega$.

Next, let us consider a case where a TFT (similar to the TFT used as a load element in a memory cell) as shown in FIG. 7 is employed as resistance element R. The on-resistance value of the TFT as shown in FIG. 7 is as small as 10 M$\Omega$ at most. Therefore, if the conditions of the above-described specific example are to be satisfied by forming resistors R1 and R2 by TFTS, a greater number of TFTs are required as resistance elements R forming resistors R1 and R2 as compared to a case where resistors R1 and R2 are formed by resistance elements R of approximately 750 M$\Omega$. The TFT used in a voltage-down circuit of the SRAM according to the third embodiment has a structure in which the resistance value thereof is increased.

FIG. 8 is a diagram showing in detail a structure of a TFT used as a resistor of the voltage-down circuit in the SRAM according to the third embodiment.

In FIG. 8, (a) is a plan view of the TFT and (b) shows a cross section taken along the line A–A' in (a).

Referring to FIG. 8, the TFT includes a metal interconnection 29, a gate insulating film 27, and a polysilicon 11. A part of metal interconnection 29 is used as a gate G. Polysilicon 11 includes a drain D, a channel C, and a source S.

When a TFT is used as a resistance element R, contact hole 5 and metal interconnection 3 are regarded as forming a part of the TFT. In other words, the resistance value of a TFT as resistance element R includes the resistance values of contact hole 5 and the like.

On polysilicon 11, gate insulating film 27 is formed, which is a gate oxide film or the like. Metal interconnections 29 and 3 are formed on gate insulating film 27. Metal interconnections 29 and 3 are, for example, aluminum interconnections. Contact hole 5 is formed at gate insulating film 27. Metal interconnection 29 and polysilicon 11 are connected by contact hole 5. Polysilicon 11 and metal interconnection 3 are connected by contact hole 5. In contact hole 5, a conductive layer is formed, which is formed of metal such as aluminum. Channel C has a width W and a length L. In other words, the channel width is indicated as W and the channel length as L.

Gate insulating film 27 is increased in thickness by employing. as a gate electrode G metal interconnection 29 formed at the same layer as the metal interconnection used for a signal interconnection. Gate insulating film 27 has a thickness of 2000–5000 Å in this case. As a result, the on-resistance value of the TFT can be made several hundred M$\Omega$ suitable for use as resistance element R of the voltage-down circuit. A current flowing through the TFT of FIG. 8 when it is turned on is smaller than the current flowing through the TFT of FIG. 7 when turned on. The gate insulating film of the TFT used as a load element of a memory cell (TFT in FIG. 7) has a thickness of 150–500 Å.

In the TFT shown in FIG. 7 as well, gate insulating film 17 may have a thickness of 2000–5000 Å. In this case as well, the on-resistance value of the TFT can be made several hundred M$\Omega$ suitable for use as resistance element R of the voltage-down circuit.

An additional step is required in the process of manufacturing an SRAM to form gate insulating film 17 of the TFT in FIG. 7 having a greater thickness than the gate insulating film of the TFT (normal TFT) used as a load element of a memory cell so as to increase the resistance value.

Metal interconnection 29 which is at a layer over polysilicon 11 is used as a gate of the TFT shown in FIG. 8 according to the third embodiment. In other words, the gate of the TFT used in the third embodiment is formed by a metal interconnection layer formed at the same time as any metal interconnection layer used as a signal interconnection. Thus, gate insulating film 27 has an increased thickness by using as a gate metal interconnection 29 formed at the same layer as the metal interconnection used as a signal interconnection or the like. Since the step of forming the metal interconnection used as a signal interconnection or the like can be utilized as a step of increasing the thickness of gate insulating film 27, no additional step is required.

Gate insulating film 27 located under metal interconnection 29 can be formed relatively easily by employing low melting point glass such as BPSG (Boro-Phospho Silicated Glass). Although the metal interconnection at a first layer is used for metal interconnections 29 and 3, the metal interconnection at a second layer over the first layer or a metal interconnection over the second layer can also be employed. Metal interconnections 29 and 3 are formed of, for example, aluminum.

As described above, voltage-down circuit 2 in the SRAM according to the second embodiment shown in FIG. 6 is used as the voltage-down circuit of the SRAM according to the third embodiment. When a TFT is employed as a resistance element forming resistor R1–R3, the TFT is considered as including contact hole 5 and the like. In other words, the resistance value of the TFT is regarded as including the resistance value of contact hole 5. Therefore, the voltage-down circuit of the SRAM according to the third embodiment is different from that of the SRAM according to the second embodiment only in the structure of the TFT. As a result, the SRAM according to the third embodiment offers the effects similar to those of the SRAM according to the second embodiment.

The metal interconnection formed at the same layer as the metal interconnection used for a signal interconnection or the like is used for a gate of the TFT in the voltage-down circuit of the SRAM according to the third embodiment to increase the thickness of the gate insulating film. Thus, the thickness of the gate insulating film can be increased for a higher resistance value of the TFT without requiring any additional step, avoiding increase in cost.

Since metal interconnection 29 formed at the same layer as the metal interconnection used for a signal interconnection or the like is used for the gate of the TFT in voltage-down circuit 2, the on-resistance value of the TFT can be easily made greater than that of the TFT shown in FIG. 7. When the resistance values of resistors R1–R3 are to be increased for reduction in power consumption of the SRAM, resistors R1–R3 can be formed easily by a smaller number of TFTs as compared to the case where resistors R1–R3 are formed by the TFTs in FIG. 7. The similar effects can be obtained by increasing the thickness of gate insulating film 17 of the TFT shown in FIG. 7 to 2000–5000 Å.

Since gate insulating film 27 of the TFT used in the voltage-down circuit of the SRAM according to the third embodiment can be formed of low melting point glass such as BPSG, the gate insulating film can be formed relatively easily. Gate insulating film 17 of the TFT shown in FIG. 7 can also be formed by low melting point glass such as BPSG to increase the thickness thereof. The similar effects can be obtained in this case as well.

In the TFT used in the voltage-down circuit of the SRAM according to the third embodiment, electric field between polysilicon 29 and polysilicon 11 is relaxed by providing gate insulating film 27 having a greater thickness than the gate insulating film of the TFT used as a load element of a memory cell. As a result, reliability of the TFT in voltage-down circuit 2 directly receiving external power supply voltage Vcc is secured. More specifically, if the gate insulating film is thin as in the TFT used as a load element of a memory cell, the TFT may be damaged by directly receiving external power supply voltage Vcc, and such damage can be easily prevented by using the TFT shown in FIG. 8. The similar effects can be obtained by increasing the thickness of gate insulating film 17 of the TFT shown in FIG. 7 to 2000–5000 Å.

Embodiment 4

A voltage-down circuit of an SRAM according to a fourth embodiment of the present invention is formed by providing capacitors between a node having external power supply voltage Vcc and node N1 and between a node having the ground voltage and node N1 in voltage-down circuit 57 shown in FIG. 23.

Figure 9:
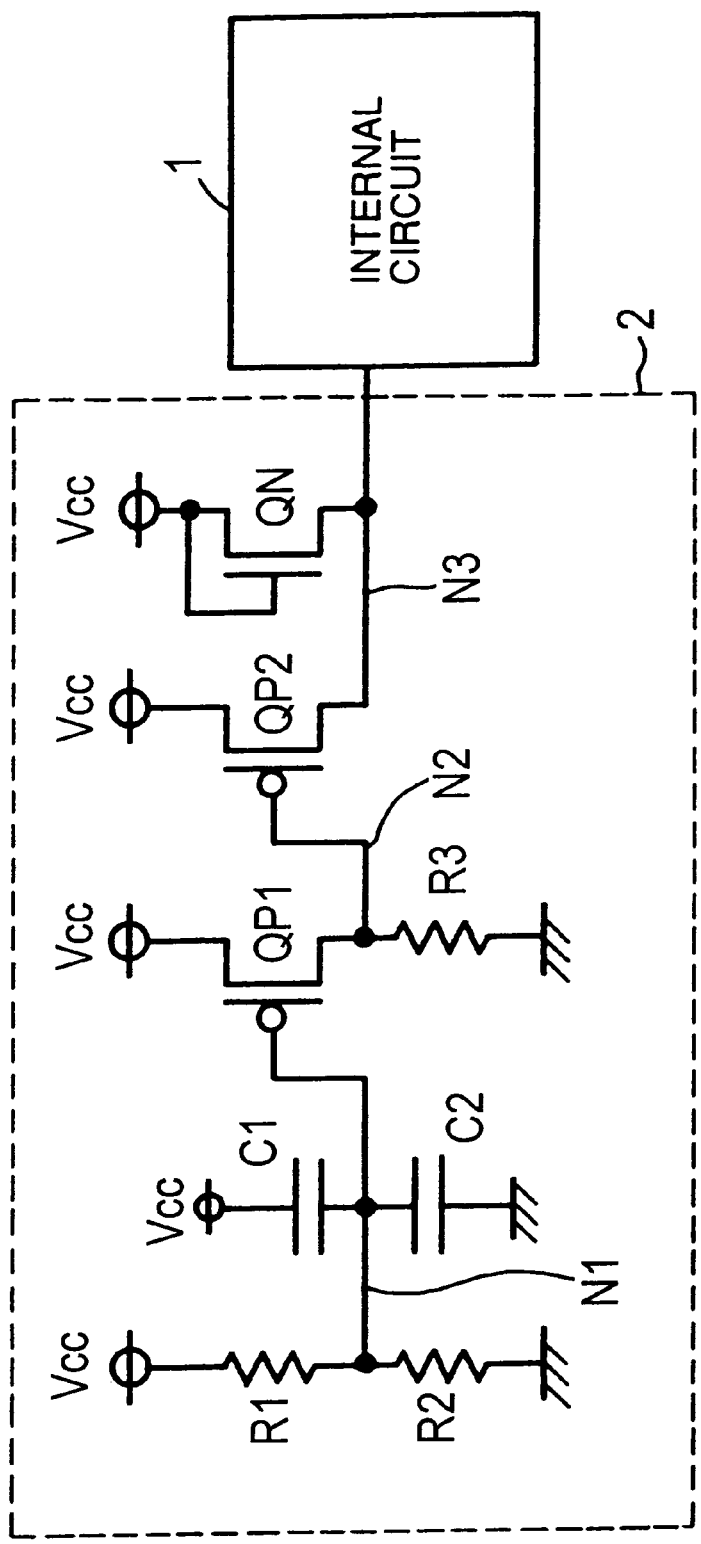
FIGS. 9–11 are circuit diagrams showing in detail a part Qf SRAMs according to fourth through sixth embodiments of the present invention.

FIG. 9 is a circuit diagram showing in detail a part of the SRAM according to the fourth embodiment of the present invention. The portions similar to those in FIG. 1 are labeled with the same reference numerals and description thereof will not be repeated.

Referring to FIG. 9, a part of the SRAM according to the fourth embodiment includes internal circuit 1 and voltage-down circuit 2. Voltage-down circuit 2 includes resistors R1, R2 and R3, capacitors C1 and C2, PMOS transistors QP1 and QP2, and NMOS transistor QN.

Resistors R1 and R2 are connected in series between a node having external power supply voltage Vcc and a node having the ground voltage. Capacitor C1 is connected between a node with external power supply voltage Vcc and node N1. Capacitor C2 is connected between node N1 and a node having the ground voltage. PMOS transistor QP1 and resistor R3 are connected in series between a node with external power supply voltage Vcc and a node with the ground voltage. PMOS transistor QP1 has a gate connected to node N1.

PMOS transistor QP2 is connected between a node having external power supply voltage Vcc and node N3. PMOS transistor QP2 has a gate connected to node N2. NMOS transistor QN is connected between a node having external power supply voltage Vcc and node N3, and has a gate connected to a node having external power supply voltage Vcc. Node N3 is connected to internal circuit 1.

When external power supply voltage Vcc is applied, the voltage of node N1 is designed to attain a value as indicated in the following expression by resistors R1 and R2.

$$\frac{R2}{R1+R2}Vcc \quad (2)$$

Here, the resistance value of resistor R1 is indicated as R1 and the resistance value of resistor R2 as R2. In the conventional voltage-down circuit 57 shown in FIG. 23 as well, the voltage of node N1 is designed to have a value as the above expression [2]. The conventional voltage-down circuit 57, however, has the following problem. Let us now consider change in voltage of node N1 upon power-on. For example, if external power supply voltage Vcc is rapidly boosted from 0 V to 5 V, node N1 attains a desired voltage of (R2/(R1+R2)) Vcc lagging far behind the time when external power supply voltage Vcc reaches 5 V.

This phenomenon is more conspicuous as the resistance values of resistors R1 and R2 are increased to seek reduction in power consumption of the entire chip. Although external power supply voltage Vcc reaches a predetermined value, node N1 attains an unintended voltage, whereby turn on/off of PMOS transistor QP1 cannot be controlled as intended. As a result, the intended voltage cannot be applied to internal circuit 1.

In voltage-down circuit 2 for use in the SRAM according to the fourth embodiment, capacitors C1 and C2 are connected to node N1 and the relationship of R1:R2=C2:C1 is established, where the capacitance value of capacitor C1 is represented as C1 and the capacitance value of capacitor C2 as C2. Thus, the relationship as expressed in the following equation is established.

$$\frac{R2}{R1+R2}Vcc = \frac{C1}{C1+C2}Vcc \quad (3)$$

Thus, even if external power supply voltage Vcc increases rapidly, node N1 attains the designed voltage as represented in expression [2] without lagging behind the rapid increase in external power supply voltage Vcc due to capacitance division. Consequently, voltage-down circuit 2 can operate as intended even upon power-on, thereby allowing supply of the intended voltage to internal circuit 1.

Description will now be made of basic operation of voltage-down circuit 2. When external power supply voltage Vcc is a low voltage of, for example, 3 V lower than the predetermined voltage, PMOS transistor QP1 is turned off by the voltage of node N1 which is determined by the ratio of the resistance value of resistor R1 to that of resistor R2. As a result, the voltage of node N2 is decreased to as low as approximately 0 V by resistor R3, thereby turning on PMOS transistor QP2. As a result, external power supply voltage Vcc is applied to node N3 as an internal voltage through PMOS transistor QP2. In other words, internal circuit 1 receives external power supply voltage Vcc through PMOS transistor QP2.

In contrast, when external power supply voltage Vcc is a high voltage of, for example, 5 V exceeding the predetermined voltage, PMOS transistor QP1 is turned on by the voltage of node N1. As a result, the voltage of node N2 is increased to be close to external voltage Vcc and PMOS transistor QP2 is turned off. Thus, the voltage (current) to be applied to internal circuit 1 is all conveyed through NMOS transistor QN. Therefore, a voltage of approximately 3.5 V is applied obtained by reducing external power supply voltage Vcc of 5 V by threshold voltage Vtn of NMOS transistor QN.

It should be noted that the value of the predetermined voltage (hereinafter referred to as a "switching point") as the condition for turning off PMOS transistor QP2 (turning on PMOS transistor QP1) is determined mainly by the ratio of the resistance value of resistor R1 to that of resistor R2. More specifically, the value of the predetermined voltage (switching point) as the condition for switching direct application of external power supply voltage Vcc to internal circuit 1 mainly by PMOS transistor QP2 and application of the voltage obtained by reducing external power supply voltage Vcc by threshold voltage Vtn of NMOS transistor QN to internal circuit 1 by NMOS transistor QN is determined mainly by the ratio of the resistance value of resistor R1 to that of resistor R2.

The basic operation of voltage-down circuit 2 shown in FIG. 9 is similar to that of voltage-down circuit 2 in FIG. 1. Therefore, FIG. 2 describing the basic operation of voltage-down circuit 2 shown in FIG. 1 can also be used for describing the basic operation of voltage-down circuit 2 shown in FIG. 9. The basic operation of voltage-down circuit 2 shown in FIG. 9 will be described with reference to FIG. 2.

When external power supply voltage Vcc is smaller than switching point (predetermined voltage) S, PMOS transistor QP2 is on and internal voltage Vint is applied to internal circuit 1 by PMOS transistor QP2. When external power supply voltage Vcc exceeds switching point (predetermined voltage) S, PMOS transistor QP2 is off, and internal voltage Vint is applied to internal circuit 1 by NMOS transistor QN.

Thus, voltage-down circuit 2 directly applies external power supply voltage Vcc as the internal voltage to internal circuit 1 mainly through PMOS transistor QP2 when external power supply voltage Vcc is smaller than switching point S. When external power supply voltage Vcc exceeds switching point S, internal voltage Vint obtained by reducing external power supply voltage Vcc is applied to internal circuit 1 by NMOS transistor QN.

As described above, voltage-down circuit 2 in the SRAM according to the fourth embodiment is obtained by additionally providing capacitors C1 and C2 in the conventional voltage-down circuit 57 shown in FIG. 23. Thus, even when the resistance values of resistors R1 and R2 are increased for reduction in power consumption, the speed at which voltage-down circuit 2 responds to external power supply voltage Vcc is increased and voltage-down circuit 2 can be operated as intended. More specifically, even if external power supply voltage Vcc rapidly increases or decreases, node N1 attains a designed voltage by capacitance division without lagging behind the rapid increase or decrease of external power supply voltage Vcc. As a result, reduction in power consumption can be achieved and voltage-down circuit 2 can be operated as intended even during power-on, so that the intended internal voltage can be applied to internal circuit 1.

One or more resistance elements R of one kind (having substantially the same resistance value and structure) can be employed as each resistor R1–R3 as shown in FIG. 1. In such a case, the SRAM according to the fourth embodiment offers the effects similar to those of the SRAM according to the first embodiment.

One or more TFTs of one kind (having substantially the same resistance value and structure) can also be employed as each resistor R1–R3 as shown in FIG. 6. The TFT shown in FIG. 7 or FIG. 8 can be employed. In such a case, the SRAM according to the fourth embodiment gives the effects similar to those of the SRAM according to the second or third embodiment of the present invention.

Embodiment 5

The feature of an SRAM according to a fifth embodiment of the present invention will be described briefly. In a voltage-down circuit of the SRAM according to the fifth embodiment, capacitors C1 and C2 in voltage-down circuit 2 of FIG. 9 are formed by a plurality of capacitance elements of one kind (having substantially the same capacitance value and structure). Detailed description thereof will be made below.

Figure 10:
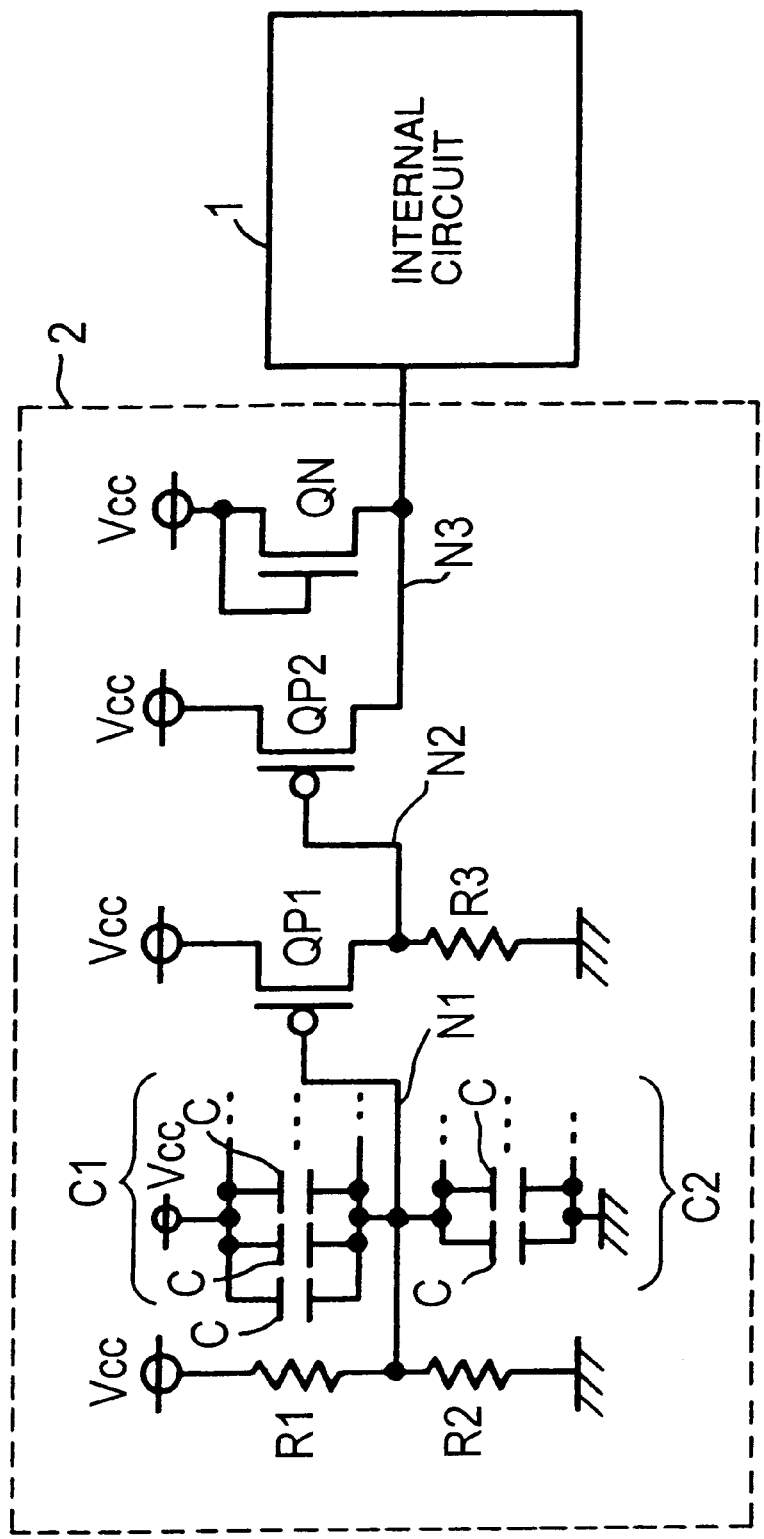

FIG. 10 is a circuit diagram showing in detail a part of the SRAM according to the fifth embodiment of the present invention. The portions similar to those in FIG. 9 are labeled with the same reference numerals and description thereof will not be repeated.

The feature different from that of the SRAM shown in FIG. 9 will be described. Capacitor C1 is formed by one or more capacitance elements C of a kind (having substantially the same capacitance value and structure). Capacitor C2 is formed by one or more capacitance elements C of a kind (having substantially the same capacitance value and structure). Capacitance element C forming capacitor C1 and capacitance element C forming capacitor C2 have the same capacitance value and the same structure. In other words, capacitance element C forming capacitor C1 and capacitance element C forming capacitor C2 are of the same kind.

One or more capacitance elements C forming capacitor C1 are connected in parallel between the node having external power supply voltage Vcc and node N1. One or more capacitance elements C forming capacitor C2 are connected in parallel between node N1 and the node having the ground voltage.

Voltage-down circuit 2 shown in FIG. 10 differs from voltage-down circuit 2 in FIG. 9 in that capacitors C1 and C2 in voltage-down circuit 2 of FIG. 10 are each formed by one or more CapaCitance elements C while capacitors C1 and C2 in voltage-down circuit 2 of FIG. 9 are each formed by one element. Therefore, capacitors C1 and C2 shown in FIG. 10 function similarly to capacitors C1 and C2 in FIG. 9. The basic operation of voltage-down circuit 2 in FIG. 10 is similar to that of voltage-down circuit 2 in FIG. 9.

As described above, capacitors C1 and C2 are each formed by one or more capacitance elements C of one kind in voltage-down circuit 2 of the SRAM according to the fifth embodiment. As a result, layout can be easily made with a CAD and correction of the layout due to a change in design can also be easily made.

The difference between voltage-down circuit 2 of the SRAM according to the fifth embodiment and that of the SRAM according to the fourth embodiment lies in whether each of capacitors C1 and C2 is formed by one element or by a plurality of elements of one kind. Accordingly, the SRAM according to the fifth embodiment gives the effects similar to those of the SRAM according to the fourth embodiment.

As resistors R1–R3, resistors similar to resistors R1–R3 shown in FIG. 9 can be employed.

Embodiment 6

In voltage-down circuit 2 of the SRAM according to the first embodiment, the switching point (a predetermined voltage at which the circuit begins to reduce external voltage Vcc to generate the internal voltage) is determined by the ratio of resistance value R1 of resistor R1 to resistance value R2 of resistor R2 (hereinafter referred to as the "R1:R2 resistance ratio"), i.e. R1:R2. However, even if the R1:R2 resistance ratio is the same as the designed value, the switching point may be deviated from the desired value due to various variation in the manufacturing process of the SRAM.

The various variation in the manufacturing process of the SRAM includes change in threshold voltage Vtp of PMOS transistors QP1 and QP2 and in resistance value R3 of resistor R3. A voltage-down circuit of an SRAM according to a sixth embodiment overcomes such problem.

Figure 11:
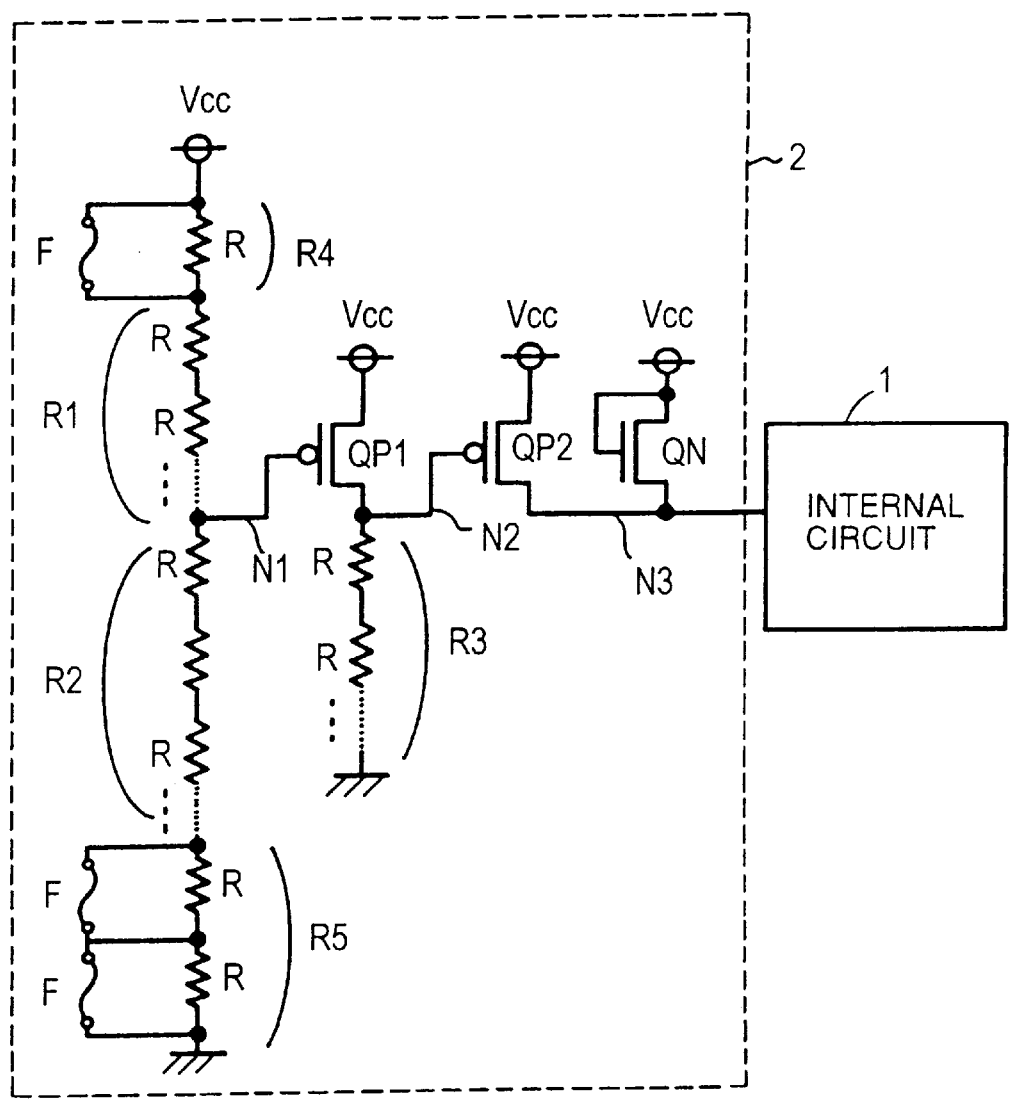

FIG. 11 is a circuit diagram showing in detail a part of the SRAM according to the sixth embodiment of the present invention. The portions similar to those in FIG. 1 are labeled with the same reference numerals and description thereof will not be repeated.

Referring to FIG. 11, a portion of the SRAM according to the sixth embodiment includes voltage-down circuit 2 and internal circuit 1. Voltage-down circuit 2 includes resistors R1, R2, R3, R4 and R5, three fuses F, PMOS transistors QP1 and QP2, and NMOS transistor QN. Resistor R4 includes resistance element R. Resistor R5 includes two resistance elements R. Each of resistors R1–R3 includes one or more resistance elements R.

Resistors R1–R5 are connected in series between the node having external power supply voltage Vcc and the node having the ground voltage. Resistor R4 is connected between the node having external power supply voltage Vcc and resistor R1. Resistor R5 is connected between the node having the ground voltage and resistor R2. The two resistance elements R forming resistor R5 are connected in series. Resistance element R used as resistor R4 is short-circuited by fuse F. Each of resistance elements R forming resistor R5 is short-circuited by fuse F.

Respective resistance elements R forming resistors R1–R5 are of the same kind, i.e. they have substantially the same resistance value and structure. Each of resistance elements R forming resistors R4 and R5 does not function as a resistor when it is short-circuited by fuse F. It does not function as a resistor until fuse F is blown off. The switching point is measured when the wafer process is completed. If the measured switching point is different from the designed switching point, the value of the switching point is adjusted by blowing some or all of the fuses F.

This will be described specifically. When three fuses F are not blown, the value of the switching point is determined by the R1:R2 resistance ratio. The resistance value of resistance element R is represented as R. Assuming that fuse F which short-circuits resistance element R forming resistor R4 is blown, the switching point is determined by the ratio of the sum of resistance value R of resistance element R forming resistor R4 and resistance value R1 of resistor R1 to resistance value R2 of resistor R2, i.e. (R1+R):R2.

Next, if only the two fuses F for short-circuiting two resistance elements R which form resistor R5 are blown, the switching point is determined by the ratio of resistance value R1 of resistor R1 to the sum of resistance value R2 of resistor R2 and resistance value 2R of resistor R5, i.e. R1:(R2+2R).

Although the above description relates to a case where fuse F for short-circuiting resistance element R which forms resistor R4 and a case where fuses F for short-circuiting two resistance elements R which form resistors R, the switching point can be adjusted by adjustment of the number of fuses F to blow off. More specifically, since the switching point is determined by the ratio of the resistance value between the node with external power supply voltage Vcc and node N1 to the resistance value between node N1 and the node with the ground voltage (hereinafter referred to as a "resistance dividing ratio"), the value of the switching point can be adjusted by adjusting the resistance value between the node with external power supply voltage Vcc and node N1 or the resistance value between node N1 and the node with the ground voltage by means of fuse F. Thus, the switching point can be constantly set at the desired (optimum) switching point irrespective of various variation in the manufacturing process of the SRAM (change in the manufacturing process of the SRAM).

Resistor R4 which is formed by resistance element R short-circuited by fuse F can be provided between resistor R1 and node N1. Resistor R5 formed by resistance elements R short-circuited by fuses F can be provided between node N1 and resistor R2.

While one resistance element R is provided for resistor R4, an arbitrary number of resistance elements R can be provided, and each resistance element R is short-circuited by the corresponding fuse F. In addition, while two resistance elements R are provided for resistor R5, an arbitrary number of elements can be provided, and each resistance element R is short-circuited by the corresponding fuse F.

If resistor R1 is formed by a plurality of resistance elements R, at least one of them can be short-circuited by fuse F. Then, the resistance value of resistor R1 is adjusted by blowing fuse F. Similarly, if resistor R2 is formed by a plurality of resistance elements R, at least one of them can be short-circuited by fuse F. The resistance value of resistor R2 is adjusted by blowing fuse F.

Voltage-down circuit 2 shown in FIG. 11 differs from the voltage-down circuit in FIG. 1 in that voltage-down circuit 2 of FIG. 11 includes resistance element R short-circuited by fuse F and the switching point can be adjusted by blowing off fuse F at completion of the wafer process while voltage-down circuit 2 of FIG. 1 does not include resistance element R short-circuited by fuse F. Thus, the basic operation of voltage-down circuit 2 of FIG. 11 is similar to that of voltage-down circuit 2 of FIG. 1.

As described above, in voltage-down circuit 2 of the SRAM according to the sixth embodiment, resistance element R short-circuited by fuse F is provided between resistor R1 and the node having external power supply voltage Vcc, and two resistance elements R short-circuited by two fuses F are provided between resistor R2 and the node having the ground voltage. As a result, even if the switching point is altered in the wafer process, the designed switching point can be obtained by adjusting the number of fuses F to blow at the completion of manufacturing process to change the resistance dividing ratio.

Resistor R4 can be provided between resistor R1 and node N1. Resistor R5 can be provided between node N1 and resistor R2. If resistor R1 is formed by a plurality of resistance elements R, at least one of them can be short-circuited by fuse F. If resistor R2 is formed by a plurality of resistance elements R, at least one of them can be short-circuited by fuse F. In such cases as well, the switching point can be set as designed by adjusting the number of fuses to blow at the completion of the manufacturing process to change the resistance dividing ratio if the switching point is changed in the wafer process.

In voltage-down circuit 2 of the SRAM according to the sixth embodiment, resistance element R is short-circuited directly by fuse F. Therefore, the voltage-down circuit can be simplified and the layout area can be saved as compared to the case where the fuse is blown and the resistance value is adjusted indirectly. The case where the fuse is blown and the resistance value is adjusted indirectly includes the following cases: a switch is provided between the fuse and the resistor to control turn on/off of the switch by blowing off the fuse and determine whether the resistance element should function as a resistor or not by the turn on/off of the switch.

Voltage-down circuit 2 of the SRAM according to the sixth embodiment differs from that of the SRAM according to the first embodiment in that voltage-down circuit 2 of the SRAM according to the sixth embodiment includes resistance element R short-circuited by fuse F while voltage-down circuit 2 of the SRAM according to the first embodiment does not include such element. Therefore, voltage-down circuit 2 of the SRAM according to the sixth embodiment maintains the function of voltage-down circuit 2 of the SRAM according to the first embodiment. Accordingly, the SRAM according to the sixth embodiment offers the effects similar to those of the SRAM according to the first embodiment.

Similarly to those shown in FIGS. 9 and 10, capacitor C1 can be provided between the node having external power supply voltage Vcc and node N1 and capacitor C2 can be provided between the node having the ground voltage and node N1. Structured as such, the SRAM according to the sixth embodiment offers the effects similar to those of the SRAM according to the fourth or fifth embodiment.

In addition, the TFTs shown in FIGS. 7 and 8 can be employed as resistance elements R in the voltage-down circuit of the SRAM according to the sixth embodiment. In such a case, the SRAM according to the sixth embodiment gives the effects similar to those of SRAM according to the second or third embodiment.

Embodiment 7

Figure 12:
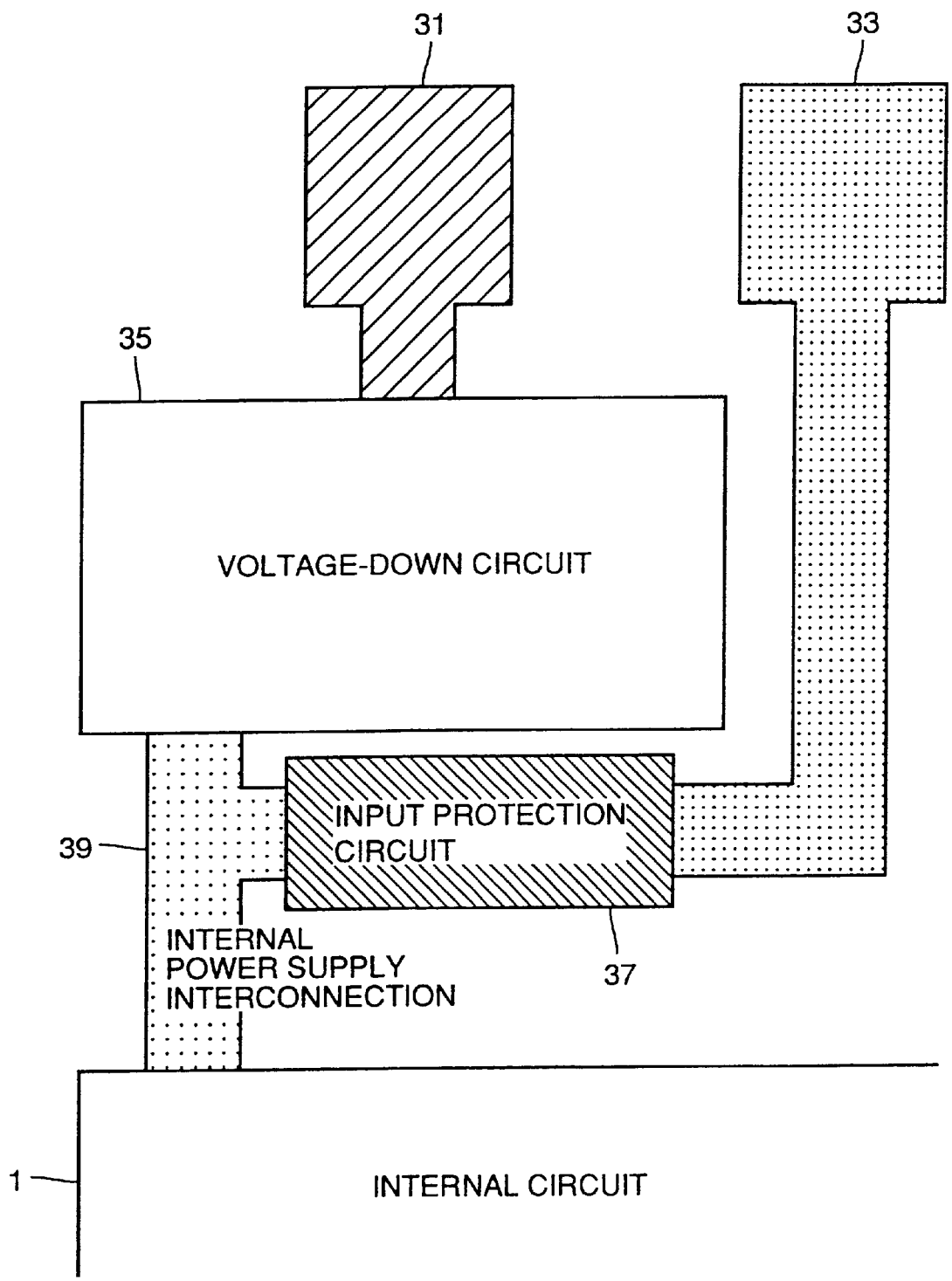
FIG. 12 is a diagram schematically showing a part of an SRAM according to a seventh embodiment of the present invention.

FIG. 12 is a diagram schematically showing a part of an SRAM according to a seventh embodiment of the present invention.

Referring to FIG. 12, a part of the SRAM according to the seventh embodiment includes first and second pads 33 and 31, a voltage-down circuit 35, an input protection circuit 37, internal circuit 1, and an internal power supply interconnection 39.

Voltage-down circuit 35 is located close to second pad 31. First pad 33 is located close to second pad 31. First pad 33 is connected to internal power supply interconnection 39 through input protection circuit 37.

Voltage-down circuit 35 receives external power supply voltage Vcc through second pad 31. voltage-down circuit 35 reduces external power supply voltage Vcc and generates an internal voltage. The internal voltage generated by voltage-down circuit 35 is applied to internal circuit 1 through internal power supply interconnection 39. Internal circuit 1 is, for example, a memory circuit (memory cell).

First pad 33 is used for checking and evaluating operation of voltage-down circuit 35 by monitoring the potential of internal power supply interconnection 39 (internal voltage) upon wafer test. More specifically, since first pad 33 is connected to internal power supply interconnection 39 through input protection circuit 37, the operation of the voltage-down circuit 35 can be checked or evaluated by monitoring the potential of first pad 33.

Another use of first pad 33 will be described. Second pad 31 receives external power supply voltage Vcc from a lead terminal (not shown) located in the proximity thereof. As a result, by arranging first pad 33 close to second pad 31, the lead terminal for applying external power supply voltage Vcc to second pad 31 can be easily bonded with first pad 33. Therefore, if external power supply voltage Vcc is to be directly applied to internal circuit 1 as the internal voltage, the unshown lead terminal and first pad 33 can be easily bonded and external power supply voltage Vcc can be applied without being reduced to internal circuit 1 through first pad 33 and input protection circuit 37. If external power supply voltage Vcc is to be reduced to generate the internal voltage, the unshown lead terminal and second and 31 are bonded to apply external power supply voltage Vcc to second pad 31.

Thus, by employing first and second pads 31 and 33, an easy switching can be made with the same chip between the case where external power supply voltage Vcc is reduced for generation of the internal voltage and a case where external power supply voltage Vcc is directly applied to internal circuit 1 as the internal voltage. Input protection circuit 37 prevents breakdown of the circuit inside the SRAM, especially internal circuit 1 used as a memory circuit (memory cell), when first pad 33 receives a surge voltage (an unexpected large voltage).

Voltage-down circuit 35 is located in the proximity of second pad 31. Therefore, an interconnection connecting second pad 31 and voltage-down circuit 35 is short in length. Consequently, noise is less likely to generate at the interconnection between second pad 31 and voltage-down circuit 35 as a result of fluctuation in voltage of the proximal interconnection. In other words, arrangement of voltage-down circuit 35 near second pad 31 reduces the effects of noise on voltage-down circuit 35.

Figure 13:
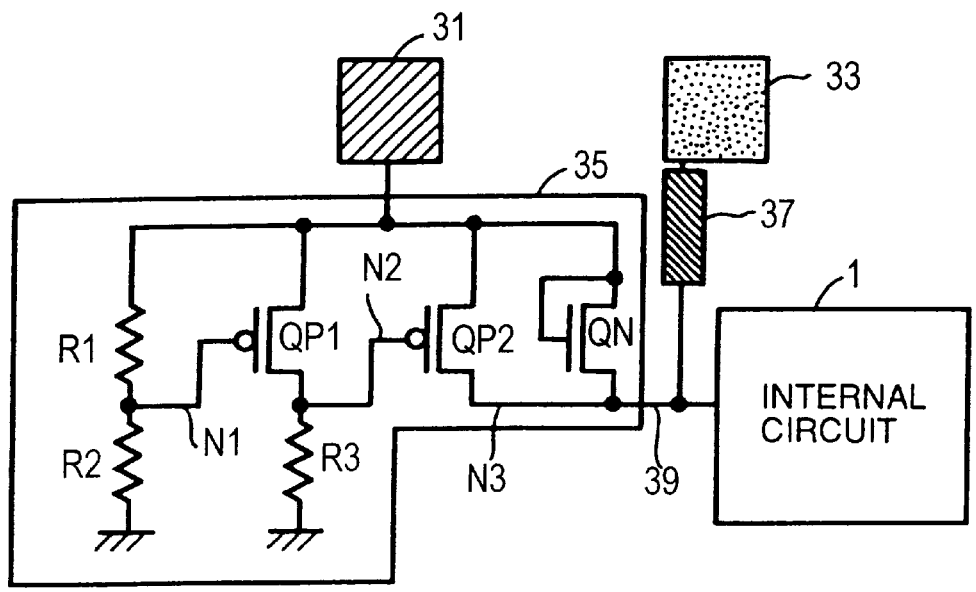
FIG. 13 is a circuit diagram showing in detail a part of the SRAM in FIG. 12.

FIG. 13 is a circuit diagram showing in detail a part of the SRAM shown in FIG. 12. The portions similar to those in FIG. 12 are indicated by the same reference numerals and description thereof will not be repeated.

Referring to FIG. 13, a part of the SRAM includes first and second pads 33 and 31, voltage-down circuit 35, input protection circuit 37, and internal power supply interconnection 39. Voltage-down circuit 35 includes resistors R1, R2 and R3, PMOS transistors QP1 and QP2, and NMOS transistor QN. Voltage-down circuit 35 is obtained by eliminating capacitors C1 and C2 from voltage-down circuit 2 shown in FIG. 9. Therefore, the operation of voltage-down circuit 35 is similar to that of voltage-down circuit 2 of FIG. 9. Voltage-down circuit 2 used in the SRAMs of the first through sixth embodiments can also be employed as voltage-down circuit 35.

Figure 14:
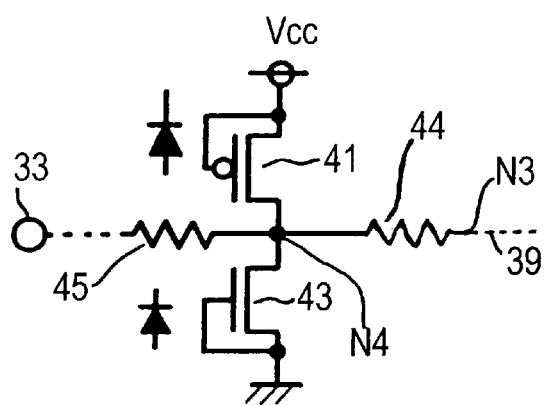
FIG. 14 is a circuit diagram showing in detail an input protection circuit shown in FIGS. 12 and 13.

FIG. 14 is a circuit diagram showing in detail input protection circuit 37 shown in FIGS. 12 and 13. The portions similar to those in FIGS. 12 and 13 are labeled with the same reference numerals and description thereof will not be repeated.

Referring to FIG. 14, the input protection circuit includes resistance elements 44 and 45, a PMOS transistor 41, and an NMOS transistor 43. Resistance element 44 is connected between node N3 (internal power supply interconnection 39) and a node N4. Resistance element 45 is connected between node N4 and first pad 33. PMOS transistor 41 is connected between a node having external power supply voltage Vcc and node N4. PMOS transistor 41 has a gate connected to the node with external power supply voltage Vcc. NMOS transistor 43 is connected between a node having the ground voltage and node N4, and has a gate connected to the node with the ground voltage.

One electrode of PMOS transistor 41 connected to the node having external power supply voltage Vcc functions as a cathode of a diode. The other electrode of PMOS transistor 41 which is connected to node N4 functions as an anode of the diode. NMOS transistor 43 has one electrode connected to the node with the ground voltage and functioning as an anode, and the other electrode connected to node N4 and functioning as a cathode of a diode.

As described above, in the SRAM according to the seventh embodiment, second pad 31 for applying external power supply voltage Vcc to voltage-down circuit 35 is located close to voltage-down circuit 35 and the interconnection connecting second pad 31 and voltage-down circuit 35 is short in length. As a result, noise generated at the interconnection between second pad 31 and voltage-down circuit 35 by, for example, fluctuation in voltage of the proximal interconnection can be reduced, so that the effects of noise on voltage-down circuit 35 can be diminished.

First pad 33 is provided in the SRAM according to the seventh embodiment. As a result, the internal voltage generated by voltage-down circuit 35 can be monitored to check and evaluate the operation of the circuit 35. In addition, first pad 33 is provided close to second pad 31. Thus, the lead terminal for applying external power supply voltage Vcc can be easily bonded to first pad 33. As a result, selection can be made easily between a case where reduced external power supply voltage Vcc is applied to internal circuit 1 as the internal voltage and a case where external power supply voltage Vcc is directly applied through input protection circuit 37.

In the SRAM according to the seventh embodiment, input protection circuit 37 is provided between internal power supply interconnection 39 and first pad 33. Thus, breakdown of internal circuit 1 can be prevented even when an unexpected great voltage is applied to first pad 33.

Embodiment 8

Figure 15:
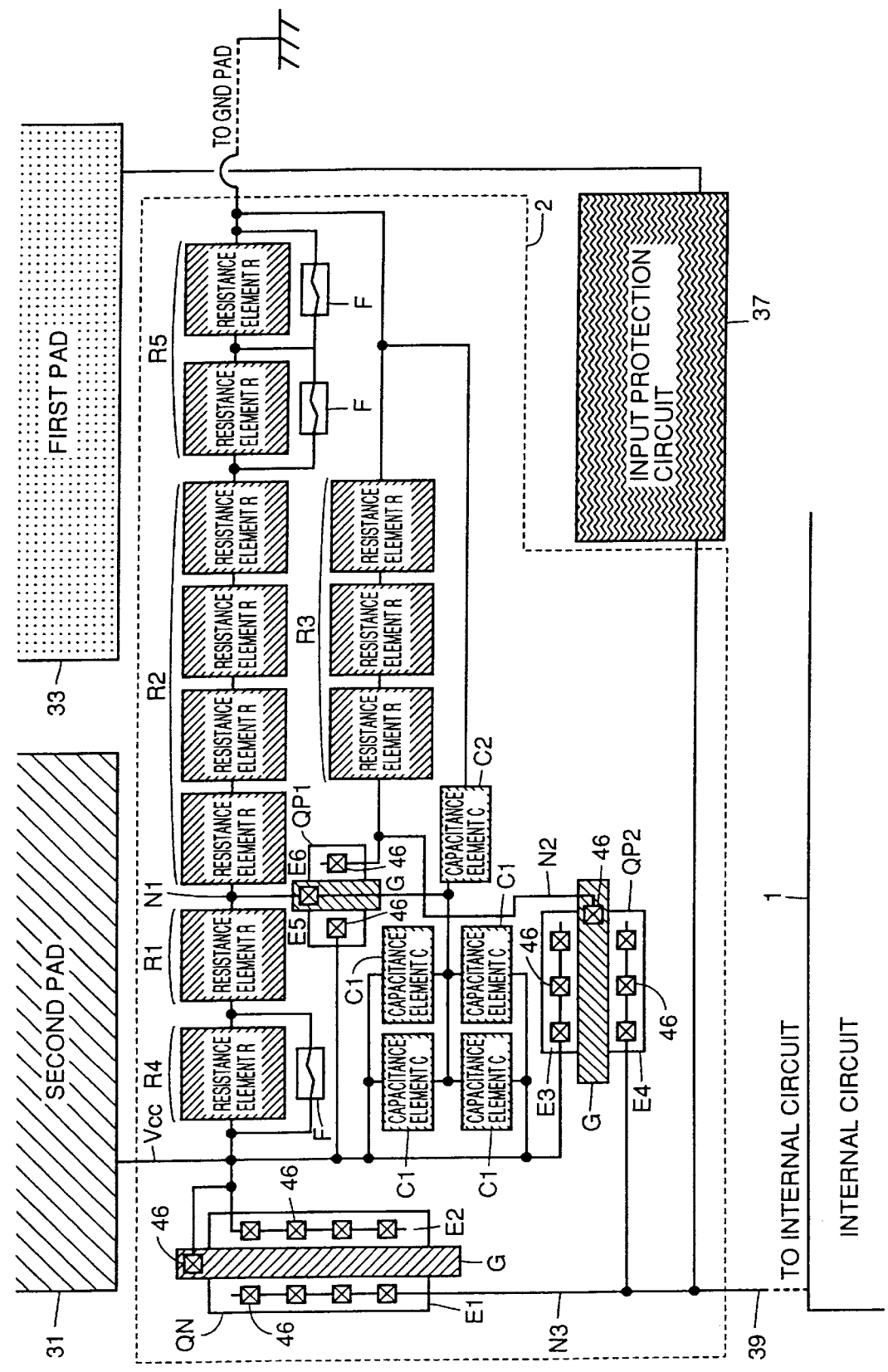
FIG. 15 is a diagram schematically showing layout of a part of an SRAM according to an eighth embodiment of the present invention.

FIG. 15 is a schematic diagram showing layout of a part of an SRAM according to an eighth embodiment of the present invention. The portions similar to those in FIGS. 1, 10, 11 and 12 are labeled with the same reference numerals and description thereof will not be repeated.

Referring to FIG. 15, the SRAM according to the eighth embodiment of the present invention includes first and second pads 33 and 31, voltage-down circuit 2, input protection circuit 37, internal circuit 1, and internal power supply interconnection 39.

Voltage-down circuit 2 includes resistors R1, R2, R3, R4 and R5, PMOS transistors QP1 and QP2, NMOS transistor QN, capacitors C1 and C2, and three fuses F. Resistor R1 is formed by one resistance element R. Resistor R2 is formed by four resistance elements R. Resistor R4 is formed by one resistance element R. Resistor R5 is formed by two resistance elements R. Resistor R3 is formed by three resistance elements R.

Resistance element R forming resistor R4 is short-circuited by fuse F. Two resistance elements R forming resistor R5 are short-circuited by two fuses F. Capacitor C1 is formed by four capacitance elements C. Capacitor C2 is formed by one capacitance element C. All the resistance elements R forming resistors R1–R5 are of the same kind (having substantially the same resistance value and structure). All the capacitance elements C forming capacitors C1 and C2 are of the same kind (having the same capacitance value and structure).

NMOS transistor QN includes gate G and electrodes E1 and E2. PMOS transistor QP1 includes gate G and electrodes E5 and E6. PMOS transistor QP2 includes gate G and electrodes E3 and E4. PMOS transistors QP1 and QP2 and NMOS transistor QN are connected to interconnections through contact holes 46. More contact holes 46 for connecting electrodes and interconnections are provided as the channel width is increased in NMOS transistor QN and PMOS transistors QP1 and QP2. The symbols x surrounded by □ all indicdte contact holes 46.

External power supply voltage Vcc is supplied from second pad 31. The ground voltage is supplied from a GND pad. Internal circuit 1 corresponds to internal circuit 1 shown in FIGS. 1, 10, 11 or 12.

Resistors R1, R2 and R3 correspond to resistors R1, R2 and R3 in FIG. 1, respectively. Resistance elements R forming resistors R1–R3 correspond to resistance elements R forming resistors R1–R3 in FIG. 1. PMOS transistors QP1 and QP2 and NMOS transistor QN correspond to PMOS transistors QP1 and QP2 and NMOS transistor QN in FIG. 1, respectively. Nodes N1, N2, and N3 correspond to nodes N1, N2, and N3 in FIG. 1, respectively.

Thus, voltage-down circuit 2 of the SRAM according to the eighth embodiment includes voltage-down circuit 2 according to the first embodiment shown in FIG. 1. Therefore, the SRAM according to the eighth embodiment gives the effects similar to those of the SRAM according to the first embodiment.

Resistors R1, R2 and R3 correspond to resistors R1, R2 and R3 in FIG. 10, respectively. Capacitors C1 and C2 correspond to capacitors C1 and C2 in FIG. 10, respectively. Capacitance elements C forming capacitors C1 and C2 correspond to capacitance elements C forming capacitors C1 and C2 in FIG. 10. PMOS transistors QP1 and QP2 and NMOS transistor QN correspond to PMOS transistors QP1 and QP2 and NMOS transistor QN in FIG. 10, respectively. Nodes N1, N2 and N3 correspond to nodes N1, N2 and N3 in FIG. 10, respectively.

Thus, voltage-down circuit 2 of the SRAM according to the eighth embodiment includes voltage-down circuit 2 of the SRAM according to the fifth embodiment shown in FIG. 10. Therefore, the SRAM according to the eighth embodiment gives the effects similar to those of the SRAM according to the fifth embodiment.

Resistors R1, R2, R3, R4 and R5 correspond to resistors R1, R2, R3, R4 and R5 in FIG. 11, respectively. The three fuses F correspond to the three fuses F in FIG. 11. Resistance elements R forming resistors R1–R5 correspond to resistance elements R forming resistors R1–R5. PMOS transistors QP1 and QP2 and NMOS transistor QN correspond to PMOS transistors QP1 and QP2 and NMOS transistor QN in FIG. 11, respectively. Nodes N1, N2 and N3 correspond to nodes N1, N2 and N3 in FIG. 10, respectively.

Thus, voltage-down circuit 2 of the SRAM according to the eighth embodiment includes voltage-down circuit 2 of the SRAM according to the sixth embodiment shown in FIG. 11. Therefore, the SRAM according to the eighth embodiment gives the effects similar to those of the SRAM according to the sixth embodiment.

First and second pads 33 and 31, internal power supply interconnection 39, and input protection circuit 37 correspond to first and second pads 33 and 31, internal power supply interconnection 39, and input protection circuit 37 in FIG. 12, respectively. Voltage-down circuit 2 corresponds to voltage-down circuit 35 shown in FIG. 12.

Thus, the SRAM according to the eighth embodiment includes the SRAM according to the seventh embodiment shown in FIG. 12. Therefore, the SRAM according to the eighth embodiment gives the effects similar to those of the SRAM according to the seventh embodiment.

In addition, the TFTs shown in FIG. 7 or 8 can be used as resistance elements R forming resistors R1–R5. In this case, the SRAM according to the eighth embodiment gives the effects similar to those of the SRAM according to the second or third embodiment.

As described above, the SRAM according to the eighth embodiment includes the SRAMs according to the first, fifth, sixth, and seventh embodiments, and therefore the operation and effects thereof are similar to those of the SRAMs according to the first, fifth, sixth, and seventh embodiments. The SRAM according to the eighth embodiment will now be described briefly.

The ratio of resistance value R1 of resistor R1 to resistance value R2 of resistor R2 (hereinafter referred to as the "R1:R2 resistance ratio") is R1:R2=1:4. The ratio of capacitance value C of capacitor C1 to capacitance value C2 of capacitor C2 (hereinafter referred to as a "C1:C2 capacitance ratio") is C1:C2=4:1. Spare resistor R4 is connected to resistor R1 and spare resistor R5 is connected to resistor R2 so as to adjust the ratio of the resistance value between the node with external power supply voltage Vcc and node N1 to the resistance value between node N1 and the node with the ground voltage (hereinafter referred to as "resistance dividing ratio"). One resistance element R forming resistor R4 and two resistance elements R forming resistor R5 are short-circuited by fuses F. The switching point is measured at the completion of the wafer process and, if the switching point is different from the designed switching point (desired switching point), the switching point can be set at the designed switching point by blowing off fuse F to adjust the resistance dividing ratio.

Since the SRAM according to the eighth embodiment is of the reduced power consumption type, external power supply voltage Vcc of 5 V is applied during normal operation such as reading/writing. In holding the data, external power supply voltage Vcc of 2–3 V is applied. Therefore, in the SRAM performing normal operation with external power supply voltage Vcc of 5 V, the switching point must be set between 3 V and 5 V. Since threshold voltage Vtp of PMOS transistor QP1 is approximately –0.8 V, the switching point is set at approximately 4 V by establishing the R1:R2 resistance ratio R1:R2 of 1:4. Since the three fuses F are not blown, the resistance dividing ratio is equal to the R1:R2 resistance ratio.

During normal operation with external power supply voltage Vcc of 5 V, PMOS transistor QP2 is turned off, whereby NMOS transistor QN reduces external power supply voltage Vcc of 5 V and generate the internal voltage. In other words, in normal operation where external power supply voltage Vcc is 5 V, a large current flows through NMOS transistor QN. In contrast, in holding data with external power supply voltage Vcc of 2–3 V, PMOS transistor QP2 is turned on, so that external power supply voltage Vcc of 3 V is applied to internal circuit 1 as the internal voltage mainly by PMOS transistor QP2. Therefore, during data holding operation of the SRAM, only a small current flows through PMOS transistor QP2. Therefore, only a small current must be flown through PMOS transistor QP2, thereby allowing reduction in size of PMOS transistor QP2 as compared to the size of NMOS transistor QN. As a result, the layout area of the SRAM can be reduced.

As described above, the SRAM according to the eighth embodiment includes all the features of the SRAMs according to the first through seventh embodiments. In other words, the SRAM according to the eighth embodiment is the combination of the SRAMs according to the first through seventh embodiments. Therefore, the SRAM according to the eighth embodiment gives at least the effects similar to those obtained by combining the SRAMs according to the first through seventh embodiments.

In the SRAM according to the eighth embodiment, PMOS transistor QP2 is turned on to generate the internal voltage only during data holding operation when the external power supply voltage is small. Consequently, PMOS transistor QP2 can be made smaller in size than NMOS transistor ON for generating the internal voltage when external power supply voltage Vcc is 5 V, thereby allowing reduction in layout area of the SRAM.

Embodiment 9

The feature of the SRAMs according to the first through eighth embodiments lies in the voltage-down circuit thereof. Originally, the voltage-down circuit is used for reducing the voltage to be applied to the internal circuit in order to secure reliability of the transistor forming the internal circuit such as a memory circuit. Therefore, reliability of the transistor forming the internal circuit can be secured also by boosting ground voltage (GND). From this viewpoint, an SRAM according to a ninth embodiment is characterized in the boosting circuit thereof.

Figure 16:
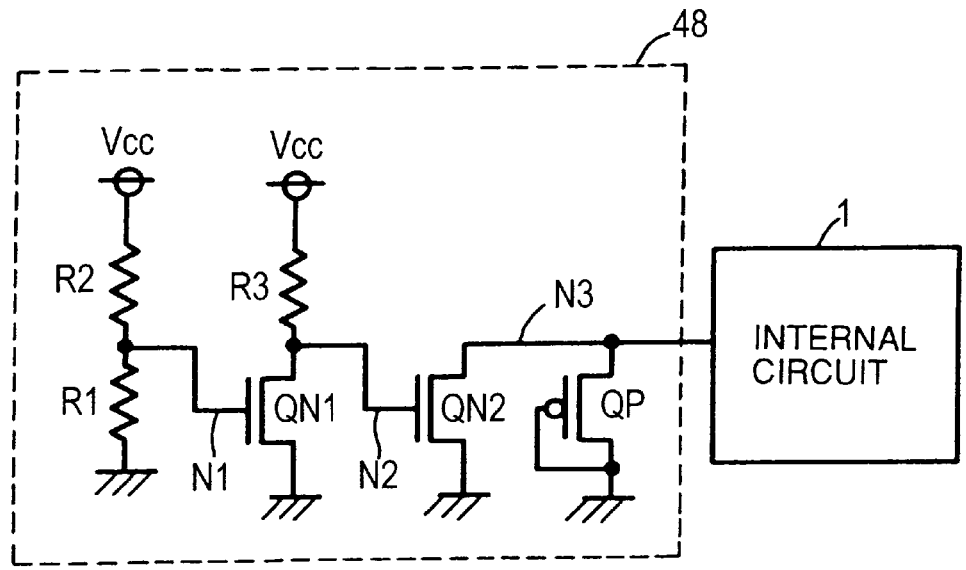
FIG. 16 is a circuit diagram showing in detail a part of an SRAM according to a ninth embodiment of the present invention.

FIG. 16 is a circuit diagram showing in detail a part of the SRAM according to the ninth embodiment of the present invention.

Referring to FIG. 16, a part of the SRAM according to the ninth embodiment includes internal circuit 1 and a boosting circuit 48 as an internal voltage generation circuit. Boosting circuit 48 includes resistors R1, R2 and R3, NMOS transistors QN1 and QN2, and PMOS transistor QP.

Resistors R1 and R2 are connected in series between a node having external power supply voltage Vcc and a node having an external ground (GND) voltage. NMOS transistor QN1 and resistor R3 are connected in series between a node having external power supply voltage Vcc and a node having the external ground voltage. NMOS transistor QN1 has a gate connected to node N1. NMOS transistor QN2 is connected between a node having the external ground voltage and node N3. NMOS transistor QN2 has a gate connected to node N2. PMOS transistor QP is connected between a node having the external ground voltage and node N3. PMOS transistor QP has a gate connected to a node having the external ground voltage. Node N3 is connected to internal circuit 1.

Internal circuit 1 is, for example, a memory circuit having a plurality of memory cells for storing information.

First, basic operation of boosting circuit 48 will be described. When external power supply voltage Vcc is a low voltage of, for example, 3 V falling short of a predetermined voltage, NMOS transistor QN1 is turned off by the voltage of node N1 which is determined by the ratio of the resistance of resistor R1 to the resistance of resistor R2 (R1:R2). As a result, the voltage of node N2 is increased close to external power supply voltage Vcc by resistor R3, thereby turning on NMOS transistor QN2. Consequently, the external ground voltage of 0 V is applied to node N3 through NMOS transistor QN2. That is, internal circuit 1 receives the external ground voltage of 0 V as the internal ground voltage mainly through NMOS transistor QN2.

In contrast, when external power supply voltage Vcc is a high voltage of, for example, 5 V exceeding a predetermined voltage, NMOS transistor QN1 is turned on by the voltage of node N1. As a result, the voltage of node N2 is reduced, and NMOS transistor QN2 is turned off. Consequently, the internal ground voltage is applied to internal circuit 1 only by PMOS transistor QP. In other words, the voltage obtained by boosting the external ground voltage of 0 V by threshold voltage Vtp of PMOS transistor QP is supplied to internal circuit 1 as the internal ground voltage.

Here, the value of a predetermined voltage (hereinafter referred to as a "switching point") as the condition for turning off NMOS transistor QN2 (turning on NMOS transistor QN1) is mainly determined by the ratio of the resistance of resistor R1 to that of resistor R2 (hereinafter referred to as a "R1:R2 resistance ratio"). More specifically, the value of a predetermined voltage (switching point) as the condition for switching between direct application of the external ground voltage to internal circuit 1 by NMOS transistor QN2 and application of the voltage obtained by boosting the external ground voltage by threshold voltage Vtp of PMOS transistor QP to internal circuit 1 is mainly determined by the ratio of the resistance value of resistor R1 to that of resistor R2 (R1:R2 resistance ratio).

Figure 17:
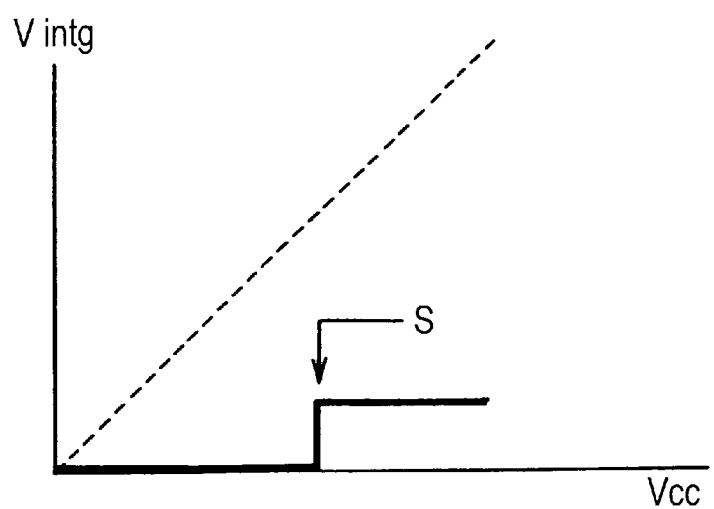
FIG. 17 is a diagram for describing operation of a boosting circuit in FIG. 16.

FIG. 17 is a diagram for describing operation of boosting circuit 48 shown in FIG. 16. Referring to FIG. 17, the horizontal axis shows external power supply voltage Vcc and the vertical axis shows the voltage of node N3 (hereinafter referred to as a "internal ground voltage Vintg"). When external power supply voltage Vcc is smaller than switching point (predetermined voltage) S. NMOS transistor QN2 is on and internal ground voltage Vintg is supplied to internal circuit 1 mainly by NMOS transistor QN2. When external power supply voltage Vcc exceeds switching point (predetermined voltage) S, NMOS transistor QN2 is off and internal ground voltage Vintg is supplied to internal circuit 1 by PMOS transistor QP. Here, the broken line indicates internal voltage Vint which increases in accordance with external power supply voltage Vcc. Internal voltage Vint is a voltage which is higher than internal ground voltage Vintg and is applied to internal circuit 1.

Thus, when external power supply voltage Vcc is smaller than switching point S, boosting circuit 48 directly applies the external ground voltage as internal ground voltage Vintg through NMOS transistor QN2. When external power supply voltage vcc exceeds switching point S, the circuit applies internal ground voltage Vintg obtained by boosting the external ground voltage to internal circuit 1 by PMOS transistor QP.

As described above, in the boosting circuit of the SRAM according to the ninth embodiment, the external ground voltage is boosted to generate internal ground voltage Vintg when external power supply voltage Vcc exceeds switching point S. Therefore, even if internal voltage Vint in accordance with the value of external power supply voltage Vcc is supplied to internal circuit 1, the voltage actually applied to internal circuit 1 is smaller than internal voltage Vint. More specifically, when external power supply Vcc exceeds switching point S, the voltage obtained by reducing internal voltage Vint by internal ground voltage Vintg which is not equal to 0 V is applied to internal circuit 1.

As a result, in the SRAM according to the ninth embodiment, the transistor included in internal circuit 1 is prevented from receiving a great voltage even if external power supply voltage Vcc is great, so that reliability of the transistor included in internal circuit 1 can be improved.

Embodiment 10

A boosting circuit as an internal voltage generation circuit of an SRAM according to a tenth embodiment of the present invention is different from boosting circuit 48 shown in FIG. 16 in the following point. While resistors R1, R2 and R3 of boosting circuit 48 in FIG. 16 are each formed by one resistance element, each resistor of the boosting circuit in the SRAM according to the tenth embodiment of the present invention is formed by one or more resistance elements having substantially the same resistance value and structure.

Figure 18:
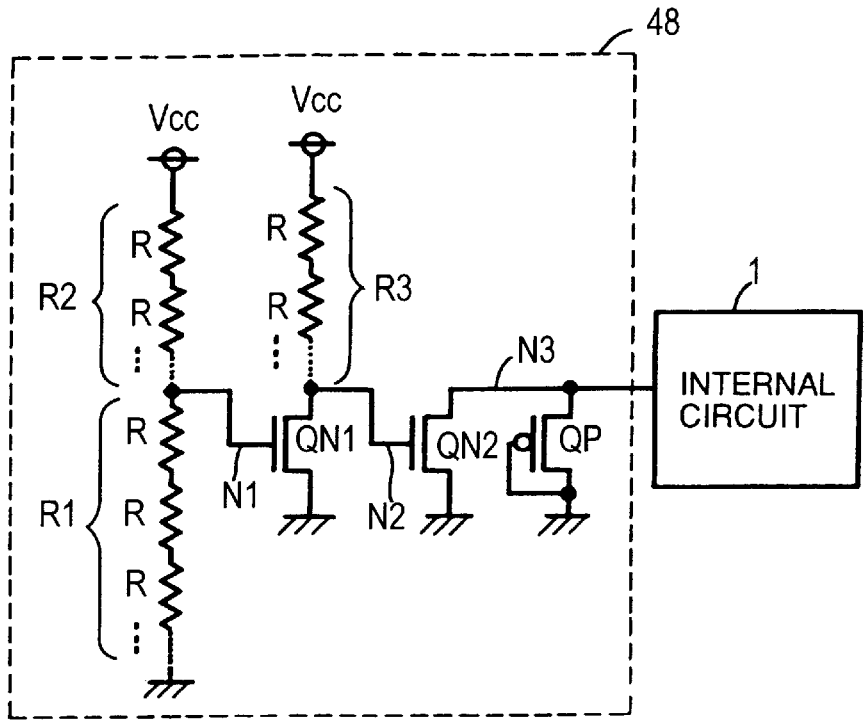
FIGS. 18–21 are circuit diagrams showing in detail a part of SRAMs according to tenth through thirteenth embodiments of the present invention.

FIG. 18 is a circuit diagram showing in detail a part of the SRAM according to the tenth embodiment of the present invention. The portions similar to those in FIG. 16 are labeled with the same reference numerals and description thereof will not be repeated.

Referring to FIG. 18, a part of the SRAM according to the tenth embodiment includes internal circuit 1 and boosting circuit 48 as an internal voltage generation circuit. Boosting circuit 48 includes resistors R1, R2 and R3, NMOS transistors QN1 and QN2, and PMOS transistor QP. Resistor R1 includes m resistance elements R. Resistor R2 includes n resistance elements R. Resistor R3 includes k resistance elements R.

Resistors R1 and R2 are connected in series between a node having external power supply voltage Vcc and a node having the external ground voltage. The m resistance elements R are connected in series between the node with external ground voltage and node N1. The n resistance elements R are connected in series between the node with external power supply voltage Vcc and node Ni.

NMOS transistor QN1 and resistor R3 are connected in series between a node with external power supply voltage Vcc and a node with the external ground voltage. NMOS transistor QN1 has a gate connected to node N1. The k resistance elements R are connected in series between node N2 and the node with external power supply voltage Vcc.

NMOS transistor QN2 is connected between a node with external ground voltage and node N3, and has a gate connected to node N2. PMOS transistor QP is connected between a node with the external ground voltage and node N3. PMOS transistor QP has a gate connected to the node with the external ground voltage. Node N3 is connected to internal circuit 1.

Internal circuit 1 is, for example, a memory circuit having a plurality of memory cells for storing information. The resistance values of m resistance elements R forming resistor R1, n resistance elements R forming resistor R2, and k resistance elements R forming resistor R3 are substantially the same. The structure of all the resistance elements R are also substantially the same.

Boosting circuit 48 shown in FIG. 18 is different from boosting circuit 48 in FIG. 16 in that boosting circuit 48 shown in FIG. 18 includes resistors R1–R3 each formed by one or more resistance elements R while boosting circuit 49 in FIG. 16 includes resistors R1–R3 each formed by one resistance element. Therefore, boosting circuit 48 of FIG. 18 differs from boosting circuit 48 of FIG. 16 only in structure of resistors R1–R3. Thus, the basic operation of boosting circuit 48 shown in FIG. 18 is similar to the basic operation of boosting circuit 48 in FIG. 16.

Description will now be made of the feature of boosting circuit 48 in the SRAM according to the tenth embodiment of the present invention. As described above, the feature thereof lies in that resistance elements R of one kind (having substantially the same resistance and substantially the same structure) are employed and three resistors R1, R2 and R3 are each formed by one or more resistance elements R. The resistance values of resistors R1, R2, R3 and R are represented as R1, R2, R3 and R, respectively. In FIG. 18, R1=m×R, R2=n×R, and R3=k×R. Here, m, n, and k represent the number of resistance elements R included in resistors R1, R2 and R3, respectively, and they are natural numbers.

Thus, resistors R1–R3 are each formed by one or more resistance elements R of one kind, so that layout can be easily made with a CAD. Correction of the layout due to a change in design can also be easily made with a CAD.

Furthermore, the circuit is more immune to change in the process parameter in the process for forming resistors R1–R3. More specifically, the resistance values of all the resistance elements R change at the same rate even if the resistance value of resistance element R is changed (the resistance value of resistance element R is different from the designed resistance value) due to displacement of the mask or the like in the process for forming resistance elements R1–R3. For example, the resistance value R of all the resistance elements R changes to resistance value R'. As a result, the ratio of resistance value R1 of resistor R1 to resistance value R2 of resistor R2 (R1:R2) for determining the most important switching point in boosting circuit 48 is constant as expressed in the following equation even if resistance value R of resistance element R is changed to resistance value R'.

$$R1:R2$$
$$= m \times R' : n \times R'$$
$$= m:n \quad (4)$$

Generally, threshold voltage Vtn of NMOS transistor QN1 is often close to 0.8 V. Consequently, by setting R1:R2=m:n=1:2–1:5, NMOS transistor QN2 is turned off and PMOS transistor QP generates internal ground voltage Vintg to be applied to internal circuit 1 when external power supply voltage Vcc is 5 V. By setting R1:R2=m:n=1:2–1:5, NMOS transistor NP2 is turned on and the external ground voltage of 0 V is directly applied as internal ground voltage Vintg to internal circuit 1 when external power supply Vcc is 3 V.

More specifically, in normal operation of the SRAM such as reading/writing, internal ground voltage Vintg obtained by boosting the external ground voltage of 0 V is applied to internal circuit 1. When the SRAM holds data, the external ground voltage of 0 V can be directly applied as internal ground voltage Vintg to internal circuit 1.

Since resistors R1–R3 are each formed by one or more resistance elements R of one kind (having substantially the same resistance value and substantially the same structure), the ratio of resistance value R1 of resistor R1 to resistance value R2 of resistor R2 (R1:R2) can be set accurately and easily. The reason is the same as described in the first embodiment with reference to FIGS. 3–5. The polysilicon high resistance element shown in FIG. 3 can be used as resistance element R in FIG. 18. The method of adjusting the resistance value of resistor R1 or R2 in boosting circuit 48 shown in FIG. 18 is similar to the adjusting method of the resistance value of resistor R1 or R2 of voltage-down circuit 2 in FIG. 1 described with FIG. 5.

As described above, resistors R1–R3 are each formed by providing resistance elements R of one kind (having substantially the same resistance value and structure) in the boosting circuit of the SRAM according to the tenth embodiment.

As a result, the R1:R2 resistance ratio (R1:R2) which is the most important factor in boosting circuit 48 can be maintained constant even if the process parameter changes in the process for forming resistors R1–R3. In other words, change in switching point can be prevented even if the resistance values of resistors R1 and R2 which determine the switching point are deviated from the designed resistance values due to change in process parameter.

By using only resistance elements R of one kind (having substantially the same resistance value and structure) layout can be very easily made with a CAD and correction of layout due to a change in design can also be made easily.

By setting the R1:R2 resistance ratio (R1:R2) at 1:2–1:5, the condition for using the SRAM with reduced power consumption can be satisfied (the external ground voltage of 0 V is not boosted and a voltage of 0 V is applied to the memory circuit as internal circuit 1 when data is held, and a voltage obtained by boosting the external ground voltage of 0 V is applied to internal circuit 1 during normal operation).

When the polysilicon high resistance element shown in FIG. 3 is used as resistance element R, the set of contact hole 5 and polysilicon (interconnection portion) 7b as well as polysilicon (resistance portion) 7a are regarded as resistance element R integrally. Resistors R1–R3 are each formed by providing one or more resistance elements R. Accordingly, the resistance value of each resistor R1–R3 is adjusted by providing one or more resistance elements R of one kind (having substantially the same resistance value and structure) taking into consideration not only the resistance value of polysilicon (resistance portion) 7a but the resistance values of contact hole 5 and polysilicon (interconnection portion) 7b. As a result, the R1:R2 resistance ratio (R1:R2) which is the most important factor in boosting circuit 48 can be set accurately and easily.

Furthermore, reduction in power consumption of the entire SRAM can be sought by forming resistors R1–R3 with high resistance elements.

Embodiment 11

Using polysilicon high resistance elements as resistors R1–R3 of boosting circuit 48 in FIG. 16 brings about the problem described in the beginning of the second embodiment. The boosting circuit of an SRAM according to an eleventh embodiment overcomes such problem.

The boosting circuit of the SRAM according to the eleventh embodiment employs one or more TFTs as one or more resistance elements R forming each of resistors R1–R3 of boosting circuit 48 shown in FIG. 18. Therefore, polysilicon high resistance elements are not used as resistance elements R.

Figure 19:
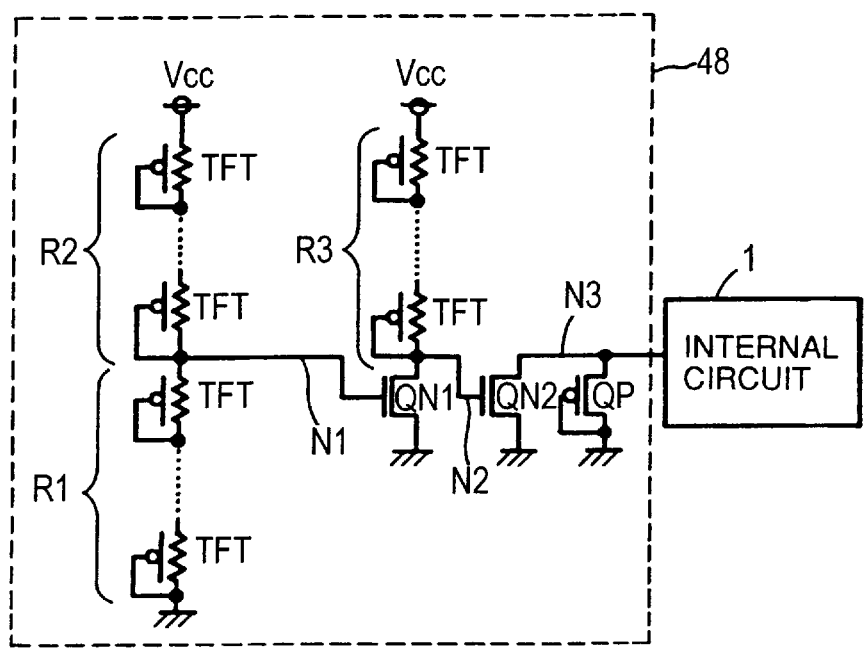

FIG. 19 is a circuit diagram showing in detail a part of the SRAM according to the eleventh embodiment of the present invention. The portions similar to those in FIG. 18 are labeled with the same reference numerals and description thereof will not be repeated.

Resistors R1, R2, and R3 are each formed by one or more TFTs of one kind (having substantially the same resistance value and structure). In other words, TFTs are used as resistance elements R in FIG. 18. The basic operation of boosting circuit 48 shown in FIG. 19 is similar to the basic operation of boosting circuit 48 shown in FIG. 18.

TFTs forming resistors R1–R3 of boosting circuit 48 shown in FIG. 19 are similar to the TFTs shown in FIG. 7.

As described above, one or more TFTs of one kind (having substantially the same resistance value and structure) are employed to form resistor R1–R3 in boosting circuit 48 of the SRAM according to the eleventh embodiment. That is, the boosting circuit of the SRAM according to the eleventh embodiment is formed by using TFTs as resistance elements R of the boosting circuit (FIG. 18) of the SRAM according to the tenth embodiment. Therefore, the SRAM according to the eleventh embodiment gives the effects similar to those of the SRAM according to the tenth embodiment.

The TFTs shown in FIG. 7 are used as the resistance elements forming resistors R1–R3 in the boosting circuit of the SRAM according to the eleventh embodiment, and the TFT used as the resistance element is regarded as integrally formed by contact holes 5, 21 and 23, polysilicons 11, 9 and 13, metal interconnection 3 and gate insulating film 17 and the resistance value of the TT includes not only the resistance value of polysilicon 9 but also the resistance values of contact holes 5, 21 and 23 and polysilicons 11 and 13. In other words, resistors R1–R3 are each formed by providing one or more TFTs of one kind (having substantially the same resistance value and structure) taking into account the resistance values of contact holes 5, 21, and 23, polysilicons 11 and 13, and the like. As a result, the R1:R2 resistance ratio (R1:R2) can be set at a desired ratio accurately and easily in the boosting circuit of the SRAM according to the eleventh embodiment.

In addition, the effects similar to those of the SRAM according to the tenth embodiment can be obtained by setting the R1:R2 resistance ratio to 1:2–1:5 in the SRAM according to the eleventh embodiment.

Since the TFT used as a load element of a memory cell is employed as each of resistors R1–R3 of boosting circuit 48 of the SRAM according to the eleventh embodiment, no additional step is required for forming resistors R1–R3 in the SRAM according to the eleventh embodiment. As a result, increase in number of steps in the process for manufacturing the SRAM is suppressed, preventing increase in cost.

The TFT in FIG. 8 used in the voltage-down circuit of the SRAM according to the third embodiment can be used as the TFT shown in FIG. 19. In this case, the SRAM according to the eleventh embodiment gives the effects similar to those of the SRAM according to the third embodiment.

Embodiment 12

The boosting circuit of an SRAM according to a twelfth embodiment of the present invention is formed by providing capacitors between the node having external power supply voltage Vcc and node N1 and between the node having the external ground voltage and node N1 in boosting circuit 48 shown in FIG. 16.

Figure 20:
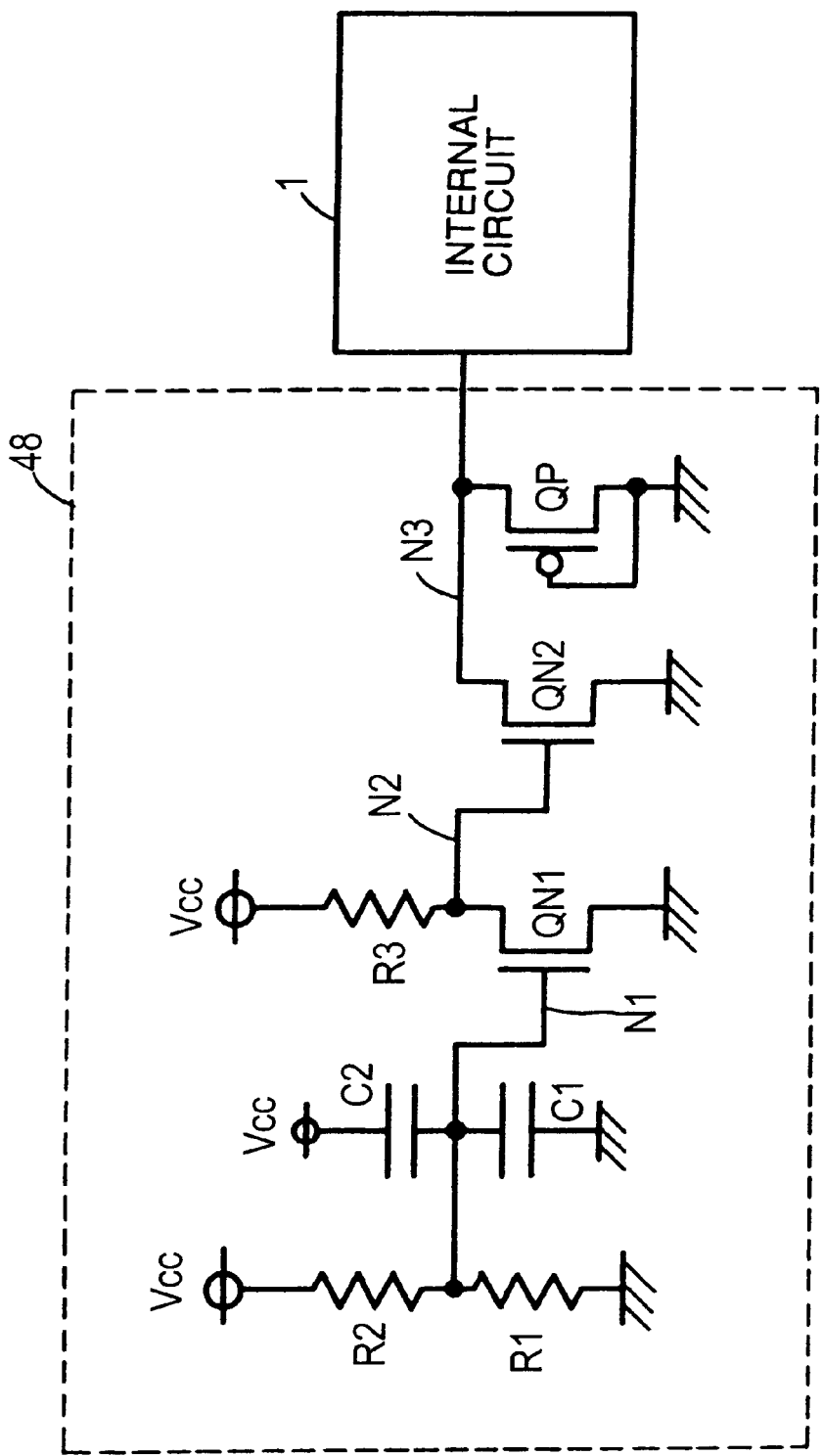

FIG. 20 is a circuit diagram showing in detail a part of the SRAM according to the twelfth embodiment of the present invention. The portions similar to those in FIG. 16 are labeled with the same reference numerals and description thereof will not be repeated.

Referring to FIG. 20, a part of the SRAM according to the twelfth embodiment includes boosting circuit 48 and internal circuit 1. Boosting circuit 48 includes resistors R1, R2 and R3, capacitors C1 and C2, NMOS transistors QN1 and QN2, and PMOS transistor QP.

Resistors R1 and R2 are connected in series between the node having external power supply voltage Vcc and the node having the external ground voltage. Capacitor C1 is connected between the node with the external ground voltage and node N1. Capacitor C2 is connected between node N1 and the node with external power supply voltage Vcc. NMOS transistor QN1 and resistor R3 are connected in series between the node with external power supply voltage Vcc and the node with the external ground voltage. NMOS transistor QN1 has a gate connected to node N1.

NMOS transistor QN2 is connected between the node with the external ground voltage and node N3, and has a gate connected to node N2. PMOS transistor QP is connected between the node with the external ground voltage and node N3. PMOS transistor QP has a gate connected to the node with the external ground voltage. Node N3 is connected to internal circuit 1.

Node N1 is designed to attain the voltage as represented in the following expression by resistors R1 and R2 when external power supply voltage Vcc is applied.

$$\frac{R1}{R2+R1}Vcc \qquad (5)$$

Here, the resistance value of resistor R1 is represented as R1, and the resistance value of resistor R2 as R2. The voltage of node N1 is designed to attain a value as represented in expression (5) also in boosting circuit 48 shown in FIG. 16. Boosting circuit 48 shown in FIG. 16, however, gives rise to the following problem. Let us consider the change in voltage of node N1 in FIG. 16 upon powering on. For example, if external power supply voltage Vcc is rapidly boosted from 0 V to 5 V, node N1 attains a desired voltage (R1/(R2+R1)) vcc lagging far behind the time when external power supply voltage Vcc reaches 5 V.

This phenomenon becomes more conspicuous as the resistance values of resistors R1 and R2 are increased to reduce power consumption of the entire chip. Although external power supply voltage Vcc reaches a predetermined voltage, node N1 attains an unintended voltage and turn on/off of NMOS transistor QN1 cannot be controlled as intended. As a result, the intended voltage cannot be applied to internal circuit 1.

In boosting circuit 48 for use in the SRAM according to the twelfth embodiment, capacitors C1 and C2 are connected to node N1 and the ratio R1:R2 is made equal to C2:C1, where the capacitance value of capacitor C1 is represented as C1 and that of capacitor C2 is represented as C2. Therefore, a relationship expressed as the following equation is established.

$$\frac{R1}{R2+R1}Vcc = \frac{C2}{C2+C1}Vcc \qquad (6)$$

Structured as such, even if external power supply voltage Vcc rapidly increases, node N1 achieves the designed voltage as represented in expression (5) due to capacitance division without lagging behind the rapid increase in external power supply voltage Vcc. As a result, boosting circuit 48 can be operated as intended upon, for example, powering on, and an intended voltage can be applied to internal circuit 1.

The basic operation of boosting circuit 48 shown in FIG. 20 is similar to that of boosting circuit 48 shown in FIG. 16.

As described above, boosting circuit 48 of the SRAM according to the twelfth embodiment is formed by additionally providing capacitors C1 and C2 in boosting circuit 48 shown in FIG. 16. Therefore, even if the resistance values of resistors R1 and R2 are increased to seek reduction in power consumption, the speed at which boosting circuit 48 responds to external power supply voltage Vcc is increased, so that boosting circuit 48 can be operated as intended. In other words, even if external power supply voltage Vcc is increased or decreased rapidly, node N1 can attain the designed voltage due to capacitance division without lagging behind the rapid increase or decrease of external power supply voltage Vcc. As a result, boosting circuit 48 can be operated as intended even upon powering on and reduction in power consumption can be achieved at the same time, so that an intended internal ground voltage can be applied to internal circuit 1.

One or more resistance elements R of one kind (having substantially the same resistance value and structure) can be used as each of resistors R1–R3 as shown in FIG. 18. In this case, the SRAM according to the twelfth embodiment gives the effects similar to those of the SRAM according to the tenth embodiment.

In addition, one or more TFTs of one kind (having substantially the same resistance value and structure) can be used as resistor R1–R3 as shown in FIG. 19. In this case, the TFTs shown in FIG. 7 or FIG. 8 can be used, and the SRAM according to the twelfth embodiment gives the effects similar to those of the SRAM according to the eleventh embodiment.

The SRAM according to the twelfth embodiment is different from the SRAM according to the ninth embodiment in that capacitors C1 and C2 are provided in the boosting circuit of the SRAM according to the twelfth embodiment while such capacitors are not provided in the boosting circuit of the SRAM according to the ninth embodiment. Therefore, the basic operation of the boosting circuit in the SRAM according to the twelfth embodiment is similar to that of the boosting circuit of the SRAM according to the ninth embodiment. As a result, the SRAM according to the twelfth embodiment gives the effects similar to those of the SRAM according to the ninth embodiment.

Capacitors C1 and C2 in FIG. 10 described in connection with the fifth embodiment can be used as capacitors C1 and C2 in FIG. 20. In this case, the SRAM according to the twelfth embodiment gives the effects similar to those of the SRAM according to the fifth embodiment.

Embodiment 13

In boosting circuit 48 of the SRAM according to the tenth embodiment, the switching point (a predetermined voltage at which the circuit begins to boost the external ground voltage and generate the internal ground voltage) is determined by the ratio of resistance value R1 of resistor R1 to resistance value R2 of resistor R2 (the R1:R2 resistance ratio), i.e. R1:R2. However, the switching point may be deviated from a desired value even with the R1:R2 resistance ratio equal to the designed value because of various variation in the manufacturing process of the SRAM.

The various variation in the manufacturing process of the SRAM includes change in threshold voltage Vtn of NMOS transistors QN1 and QN2 and resistance value R3 of resistor R3. The boosting circuit of an SRAM according to a thirteenth embodiment overcomes such problem.

Figure 21:
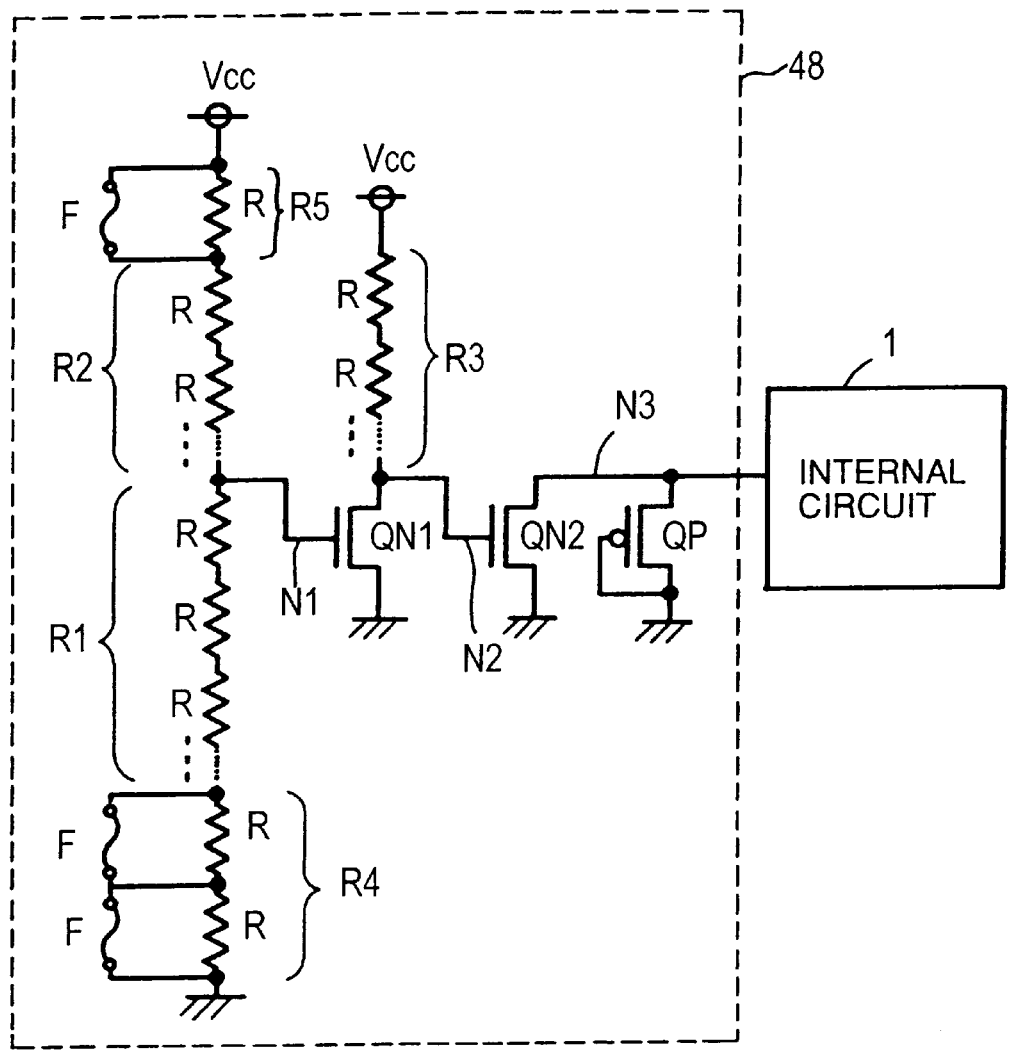

FIG. 21 is a circuit diagram showing in detail a part of the SRAM according to the thirteenth embodiment of the present invention. The portions similar to those in FIG. 18 are labeled with the same reference numerals and description thereof will not be repeated.

Referring to FIG. 21, a part of the SRAM according to the thirteenth embodiment includes boosting circuit 48 and internal circuit 1. Boosting circuit 48 includes resistors R1, R2, R3, R4 and R5, three fuses F, NMOS transistors QN1 and QN2, and PMOS transistor QP. Resistor R4 includes two resistance elements R. Resistor R5 includes resistance element R. Each of resistors R1–R3 includes one or more resistance elements R.

Resistors R1–R5 are connected in series between the node having external power supply voltage Vcc and the node having the external ground voltage. Resistor R4 is connected between the node with the external ground voltage and resistor R1. Resistor R5 is connected between the node with external power supply voltage Vcc and resistor R2. The two resistance elements R forming resistor R4 are connected in series. Resistance element R used as resistor R5 is short-circuited by fuse F. Each resistance element R forming resistor R4 is also short-circuited by fuse F.

The resistance elements R forming resistors R1–R5 are the resistance elements of the same kind, i.e. the resistance elements having substantially the same resistance value and structure. Each of resistance elements R forming resistors R4 and R5 does not function as a resistor if it is short-circuited by fuse F. It does not function as a resistor until fuse F is blown. The switching point is measured when the wafer process is completed. If the measured switching point is different from the designed switching point, the switching point is adjusted by blowing some or all of the fuses F.

More specifically, since the switching point is determined by the ratio of the resistance value between the node with the external ground voltage and node N1 to the resistance value between node N1 and the node with external power supply voltage Vcc (hereinafter referred to as the "resistance dividing ratio"), the switching point is adjusted by adjusting the resistance value between the node with the external ground voltage and node N1 or the resistance value between node N1 and the node with external power supply voltage Vcc by means of fuse F. Thus, the switching point can always be set at the designed (optimum) switching point inspite of various variation in the manufacturing process of the SRAM (change in the manufacturing process of the SRAM). The specific method of adjusting the switching point by blowing fuse F is similar to that described in the sixth embodiment.

Resistor R4 formed by resistance elements R short-circuited by fuses F can be provided between node N1 and resistor R1. Resistor R5 formed by resistance element R short-circuited by fuse F can be provided between node N1 and resistor R2.

Although resistor R5 is formed by one resistance element R, it can be formed by any number of resistance elements R, and in such a case each resistance element R is short-circuited by the corresponding fuse F. Similarly, although resistor R4 is formed by two resistance elements R, it can be formed by any number of resistance elements R, and in such a case each resistance element R is short-circuited by fuse F corresponding to each resistance element R.

Furthermore, if resistor R1 is formed by a plurality of resistance elements R, at least one of them can be short-circuited by fuse F. In such a case, the resistance value of resistor R1 can be adjusted by blowing fuse F. Similarly, if resistor R2 is formed by a plurality of resistance elements R, at least one of them can be short-circuited by fuse F, and the resistance value of resistor R2 can be adjusted by blowing fuse F.

Boosting circuit 48 in FIG. 21 differs from boosting circuit 48 in FIG. 18 in that boosting circuit 48 in FIG. 21 includes resistance element R short-circuited by fuse F and the switching point can be adjusted by blowing fuse F at the completion of the wafer process while boosting circuit 48 in FIG. 18 does not include resistance element R short-circuited by fuse F. Thus, the basic operation of boosting circuit 48 in FIG. 21 is similar to that of boosting circuit 48 in FIG. 18.

As described above, in boosting circuit 48 of the SRAM according to the thirteenth embodiment, two resistance elements R short-circuited by two fuses F are provided between resistor R1 and the node with the external ground voltage, and resistance element R short-circuited by fuse F is provided between resistor R2 and the node with external power supply voltage VCc. As a result, if the switching point is changed in the wafer process, the resistance dividing ratio can be changed by adjusting the number of fuses F to blow at the completion of the manufacturing process, thereby setting the switching point as designed.

Resistor R4 can be provided between resistor R1 and node N1, and resistor R5 can be provided between node N1 and resistor R2. If resistor R1 is formed by a plurality of resistance elements R, at least one of them can be short-circuited by fuse F. Similarly, if resistor R2 is formed by a plurality of resistance elements R, at least one of them can be short-circuited by fuse F. In these cases as well, even if the switching point is changed in the wafer process, the resistance dividing ratio can be changed by adjusting the number of fuses F to blow at the completion of the manufacturing process, so that the switching point can be set as designed.

In boosting circuit 48 of the SRAM according to the thirteenth embodiment, resistance element R is short-circuited directly by fuse F. Therefore, the boosting circuit can be simplified and the layout area can be saved as compared to the case where the resistance value is adjusted indirectly by blowing fuse.

Boosting circuit 48 of the SRAM according to the thirteenth embodiment differs from boosting circuit 48 of the SRAM according to the tenth embodiment only in that boosting circuit 48 of the SRAM according to the thirteenth embodiment is provided with resistance element R short-circuited by fuse F while boosting circuit 48 of the SRAM according to the tenth embodiment is not provided with such element. Therefore, boosting circuit 48 of the SRAM according to the thirteenth embodiment still holds the functions of boosting circuit 48 of the SRAM according to the tenth embodiment. Thus, the SRAM according to the thirteenth embodiment offers the effects similar to those of the SRAM according to the tenth embodiment.

Similarly to the circuit shown in FIG. 20, capacitors C2 and C1 can be provided between the node having external power supply voltage Vcc and node N1 and between the node having the external ground voltage and node N1, respectively. In this case, the SRAM according to the thirteenth embodiment provides the effects similar to those of the SRAM according to the twelfth embodiment.

The TFT shown in FIG. 19 can be employed as resistance element R of boosting circuit 48 in the SRAM according to the thirteenth embodiment. In this case, the SRAM according to the thirteenth embodiment provides effects similar to those of the SRAM according to the eleventh embodiment.

Embodiment 14

Figure 22:
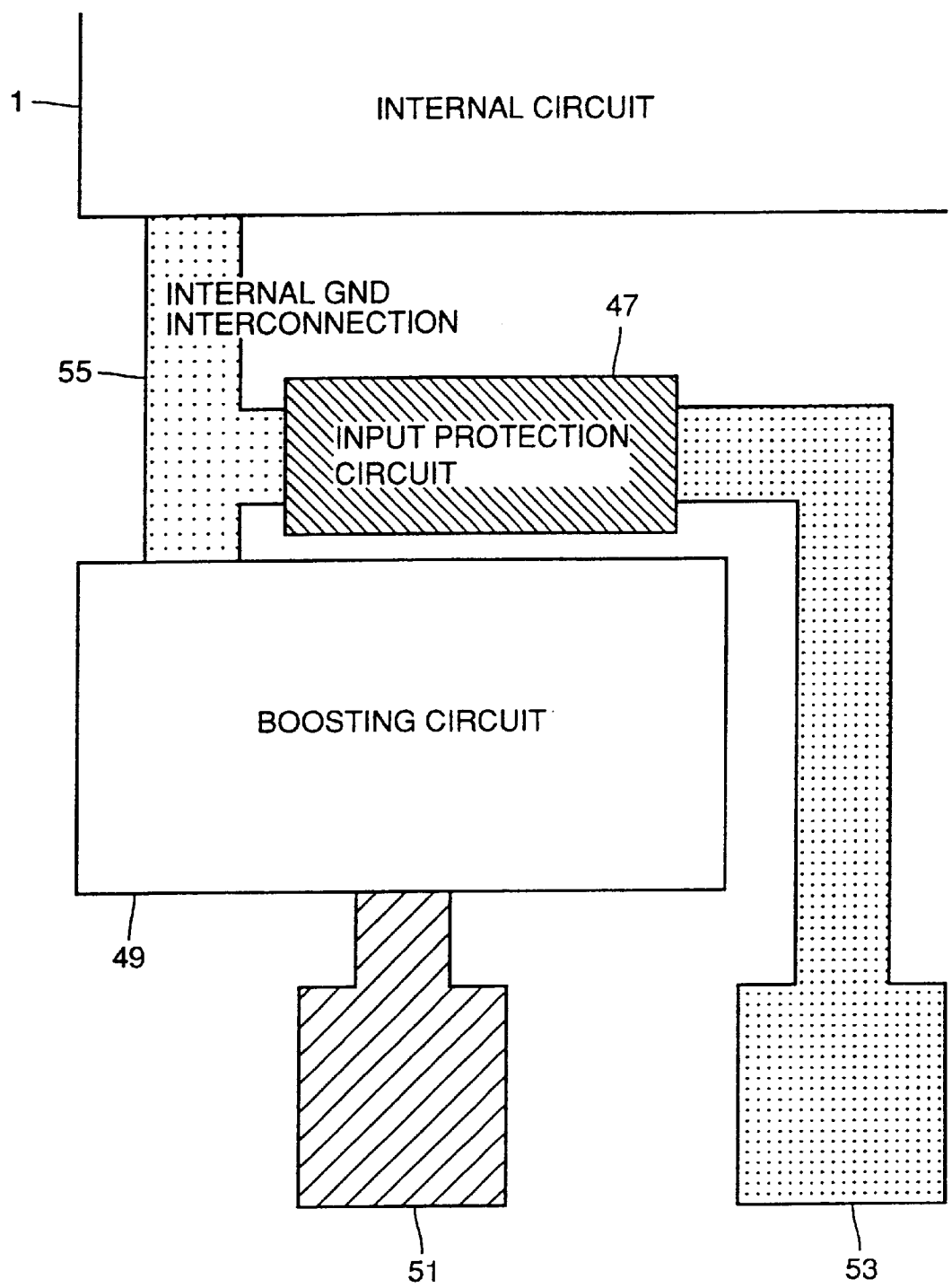
FIG. 22 is a diagram schematically showing a part of an SRAM according to a fourteenth embodiment of the present invention.

FIG. 22 schematically shows a part of an SRAM according to a fourteenth embodiment of the present invention.

Referring to FIG. 22, a part of the SRAM according to the fourteenth embodiment includes first and second pads 53 and 51, a boosting circuit 49, an input protection circuit 47, internal circuit 1, and an internal GND interconnection 55.

Boosting circuit 49 is located close to second pad 51. First pad 53 is located close to second pad 51. First pad 53 is connected to internal GND interconnection 55 through input protection circuit 47.

Boosting circuit 49 receives the external ground voltage through second pad 51. Boosting circuit 49 boosts the external ground voltage to generate an internal ground voltage. The internal ground voltage generated by boosting circuit 49 is applied to internal circuit 1 through internal GND interconnection 55. Internal circuit 1 is, for example, a memory circuit (memory cell).

First pad 53 is used for checking and evaluating the operation of boosting circuit 49 by monitoring the potential of internal GND interconnection 55 (internal ground voltage) upon wafer test. More specifically, since first pad 53 is connected to internal GND interconnection 55 through input protection circuit 47, operation of boosting circuit 49 can be checked or evaluated by monitoring the potential of first pad 53.

Another use of first pad 53 will be described. Second pad 51 receives the external ground voltage from an unshown lead terminal arranged in the proximity thereof. Thus, by arranging first pad 53 close to second pad 51, the lead terminal for applying the external ground voltage to second pad 51 can be easily bonded with first pad 53. Therefore, when the external ground voltage is to be directly applied to internal circuit 1 as the internal ground voltage, the unshown lead terminal and first pad 53 can be easily bonded and the external ground voltage can be applied to internal circuit 1 through first pad 53 and input protection circuit 47 without being boosted. when the external ground voltage is to be boosted to generate the internal ground voltage, the unshown lead terminal and second pad 51 are bonded to apply the external ground voltage to second pad 51.

By thus utilizing first and second pads 51 and 53, an easy switching can be made with the same chip between the case where the external ground voltage is to be boosted to generate the internal ground voltage and the case where the external ground voltage is to be directly applied to internal circuit 1 as the internal ground voltage. Input protection Circuit 47 prevents the circuit inside the SRAM, especially internal circuit 1 as a memory circuit (Memory cell), from breaking down when a surge voltage (an unexpected great voltage) is applied to first pad 53.

Boosting circuit 49 is arranged close to second pad 51. Therefore, the interconnection connecting second pad 51 and boosting circuit 49 is short in length. As a result, noise is less likely to generate at the interconnection between second pad 51 and boosting circuit 49 due to fluctuation in voltage of the proximate interconnection. In other words, the effects of noise on boosting circuit 49 can be reduced by arranging boosting circuit 49 in the proximity of second pad 51.

As described above, in the SRAM according to the fourteenth embodiment, second pad 51 for applying the external ground voltage to boosting circuit 49 is arranged close to boosting circuit 49, and therefore the interconnection connecting second pad 51 and boosting circuit 49 is short. Consequently, noise generated at the interconnection between second pad 51 and boosting circuit 49 because of fluctuation in voltage of the proximate interconnection or the like can be reduced, thereby diminishing the effects of noise onto boosting circuit 49.

First pad 53 is provided in the SRAM according to the fourteenth embodiment, Therefore, the internal ground voltage generated by boosting circuit 49 can be monitored to check and evaluate the operation of boosting circuit 49. In addition, first pad 53 is located close to second pad 51. Therefore, the lead terminal for applying the external ground voltage can be easily bonded to first pad 53. As a result, an easy selection can be made and set between application of the boosted external ground voltage to provide the internal ground voltage and direct application of the external ground voltage through input protection circuit 47 to internal circuit 1.

In the SRAM according to the fourteenth embodiment, input protection circuit 47 is provided between internal GND interconnection 55 and first pad 53. Therefore, even if an unexpected great voltage is applied to first pad 53, internal circuit 1 can be prevented from breaking down.

Boosting circuit 48 used in the SRAMs according to Embodiments 9–13 can be employed as boosting circuit 49. In such case, the effects similar to those given by any of the SRAMs of the ninth through thirteenth embodiments can be obtained.

Embodiment 15

An SRAM according to a fifteenth embodiment of the present invention is formed by improving resistors R1 and R2 in the respective voltage-down circuits in Embodiments 1–8 or in the boosting circuits in Embodiments 9–14. Therefore, the voltage-down circuit or the boosting circuit of the SRAM according to the fifteenth embodiment has a structure same as that of any of the voltage-down circuits or the boosting circuits of the SRAMs according to the first through fourteenth embodiments.

Description will be first made of a general resistance element. Generally, the resistance element used as a high resistance element is formed of polysilicon. The resistance value of polysilicon is directly proportional to length L and inversely proportional to width W of the polysilicon. Therefore, the resistance value of polysilicon is determined by value L/W of the ratio of length L to width W (L:W).

In the wafer process of the 0.4 $\mu$m class implemented in the future, shift of approximately 0.15 $\mu$m is generated at the actual polysilicon on the wafer with respect to the designed dimension. This is caused by various shifts or variation generated by light exposure, etching, and the like in the wafer process. Such shift and variation include displacement of the mask. Controlling and overcoming such shift of 0.15 $\mu$m at the polysilicon on the wafer are extremely difficult.

A specific example thereof will be described with reference to FIG. 3. It is assumed that resistance element R is designed to have length L of 1 $\mu$m and width W of 0.5 $\mu$m, i.e. resistance element R is designed to have value L/W=2. Under this condition, it is assumed that polysilicon (resistance portion) 7a on the actual wafer has width W of 0.65 $\mu$m due to shift of 0.15 $\mu$m. Then, L/W which determines the resistance value of polysilicon (resistance portion) 7a is equal to 1.54, 77% of the designed resistance value.

Such change in resistance value of polysllicon (resistance portion) 7a gives great effects on the value of consumed current. In addition, when the switching point is determined by the R1:R2 resistance ratio as in voltage-down circuit 2 of FIG. 1, the value of the switching point is also greatly deviated from the designed value. The SRAM according to the fifteenth embodiment overcomes such problem.

In order to avoid such problem, length L and width W of resistance element R in FIG. 3 are increased in value while maintaining its value of L/W. For example, length L and width W are increased to 10 $\mu$m and 5 $\mu$m from 1 $\mu$m and 0.5 $\mu$m, respectively. Assuming that width W has the shift of 0.15 $\mu$m due to the cause similar to the one described above, value L/W is equal to 1.94 to yield 97% resistance value of the designed value (L/W=2), since length L and width W are greater.

Change of 3% with respect to the designed value is sufficiently allowable. If the difference between the actual L/W and designed L/W is limited to 20% of the designed L/W, the effects imposed on the value of consumed current is small and the switching point is not greatly deviated from the designed value. Therefore, length L and width W of polysilicon (resistance portion) 7a is set so that the difference between the actual L/W and the design L/W is within 20% of the designed L/W.

While the description above relates to the polysilicon high resistance element used as resistance element R in FIG. 3, the same applies to the TFTs in FIGS. 7 and 8. More specifically, referring to FIGS. 7 and 8, channel length L and channel width W are increased so that the difference between the actual value L/W of ratio (L:W) of channel length L to channel width W and designed L/W is limited to 20% or lower of the designed L/W. Thus, effects imposed on the value of consumed current due to fluctuation in resistance value can be reduced, thereby preventing great deviation of the switching point from the designed value.

In conclusion, L (channel length or the length of polysilicon (resistance portion)) and W (channel width or the width of polysilicon (resistance portion)) of resistance element R as resistor R1 or R2 in Embodiments 1, 6, 7, 8, 10, 13 and 14, the TFT as resistor R1 or R2 in Embodiments 2 and 3, or resistor R1 or R2 in Embodiments 4, 5, and 7 are increased while maintaining the value of L/W, so that the difference between the actual L/W and designed L/W is contained within 20% of the designed L/W. For example, resistance element R, the FFT or resistors R1 and R2 are greater in size than the resistance element used as a load element of a memory cell in an SRAM.

As described above, in the SRAM according to the fifteenth embodiment, the values of L and W are increased so that the difference between the actual L/W and the designed L/W does not exceed 20% of the designed L/W. Therefore, even if L (channel length or the length of polysilicon (resistance portion)) or W (channel width or the width of polysilicon (resistance portion)) varies to be different from the designed value due to variation in the wafer process such as displacement of the mask, fluctuation in value of L/W which determines the resistance value, i.e. in the resistance value, can be prevented. As a result, even if L or W fluctuates due to variation in the wafer process, fluctuation in resistance value is small, thereby reducing the effects imposed on the value of consumed current of the SRAM and preventing a great deviation of the switching point of the voltage-down circuit or the boosting circuit of the SRAM from the designed value.

Regarding resistor R3 of the first through fourteenth embodiments, L and W can be set similarly as described above.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film transistor in a semiconductor memory device, comprising:
   first conductive layer;
   second conductive layer; and
   insulation means formed between said first conductive layer and said second conductive layer; wherein
      said first conductive layer includes a control electrode,
      said second conductive layer includes first and second electrodes, and
      said insulation means has a thickness greater than a thickness of a control electrode insulation film of a second thin film transistor used as a load element in a memory cell of said semiconductor memory device.

2. A thin film transistor in a semiconductor memory device having an interconnection layer for providing signal interconnection, said thin film transistor comprising:
   first conductive layer provided by said interconnection layer; second conductive layer; and
   insulation means formed between said first conductive layer and said second conductive layer; wherein
      said first conductive layer includes a control electrode,
      said second conductive layer includes first and second electrodes, and
      said insulation means has a thickness greater than a thickness of a control electrode insulation film of a second thin film transistor used as a load element in a memory cell of said semiconductor memory device.

* * * * *